United States Patent
Wang et al.

(10) Patent No.: US 9,070,723 B2
(45) Date of Patent: Jun. 30, 2015

(54) METHODS AND APPARATUS FOR CLEANING SEMICONDUCTOR WAFERS

(75) Inventors: Hui Wang, Shanghai (CN); Jian Wang, Shanghai (CN); Yue Ma, Shanghai (CN); Chuan He, Shanghai (CN)

(73) Assignee: ACM Research (Shanghai) Inc. (CN)

( * ) Notice: Subject to any disclaimer, the term of this patent is extended or adjusted under 35 U.S.C. 154(b) by 1257 days.

(21) Appl. No.: 12/452,367

(22) PCT Filed: Jul. 5, 2007

(86) PCT No.: PCT/CN2007/070234
§ 371 (c)(1),
(2), (4) Date: Jan. 29, 2010

(87) PCT Pub. No.: WO2009/003343
PCT Pub. Date: Jan. 8, 2009

(65) Prior Publication Data
US 2010/0139710 A1  Jun. 10, 2010

(51) Int. Cl.
*B08B 3/10* (2006.01)
*H01L 21/67* (2006.01)
*H01L 21/02* (2006.01)

(52) U.S. Cl.
CPC .... *H01L 21/67051* (2013.01); *H01L 21/02052* (2013.01); *H01L 21/02063* (2013.01); *H01L 21/6704* (2013.01)

(58) Field of Classification Search
None
See application file for complete search history.

(56) References Cited

U.S. PATENT DOCUMENTS

| | | | | |
|---|---|---|---|---|
| 5,958,794 A | * | 9/1999 | Bruxvoort et al. | 438/692 |
| 6,045,605 A | * | 4/2000 | Doi et al. | 106/3 |
| 6,539,959 B1 | * | 4/2003 | Ohroku et al. | 134/153 |
| 2004/0020520 A1 | | 2/2004 | Kim et al. | |
| 2004/0226654 A1 | | 11/2004 | Hongo et al. | |
| 2005/0003737 A1 | * | 1/2005 | Montierth et al. | 451/5 |
| 2006/0090848 A1 | | 5/2006 | Koga et al. | |
| 2006/0118132 A1 | | 6/2006 | Bergman et al. | |
| 2006/0130968 A1 | * | 6/2006 | Orii et al. | 156/345.11 |
| 2007/0295367 A1 | * | 12/2007 | Okorn-Schmidt | 134/32 |

FOREIGN PATENT DOCUMENTS

| | | |
|---|---|---|
| CN | 87103659 A | 11/1987 |
| CN | 1399312 A | 2/2003 |
| CN | 1581444 A | 2/2005 |
| JP | 8130202 A | 5/1996 |
| JP | 2005-522041 A | 7/2005 |
| KR | 10-0457053 | 11/2004 |
| KR | 10-0468737 | 1/2005 |

* cited by examiner

*Primary Examiner* — Michael Kornakov
*Assistant Examiner* — Ryan Coleman
(74) *Attorney, Agent, or Firm* — Miskin & Tsui-Yip LLP; Gloria Tsui-Yip

(57) ABSTRACT

An apparatus for cleaning a surface of wafer or substrate includes a plate being positioned with a gap to surface of the wafer or substrate, and the plate being rotated around an axis vertical to surface of wafer or substrate. The rotating plate surface facing surface of the wafer or substrate has grooves, regular patterns, and irregular patterns to enhance the cleaning efficiency. Another embodiment further includes an ultra sonic or mega sonic transducer vibrating the rotating plate during cleaning process.

36 Claims, 28 Drawing Sheets

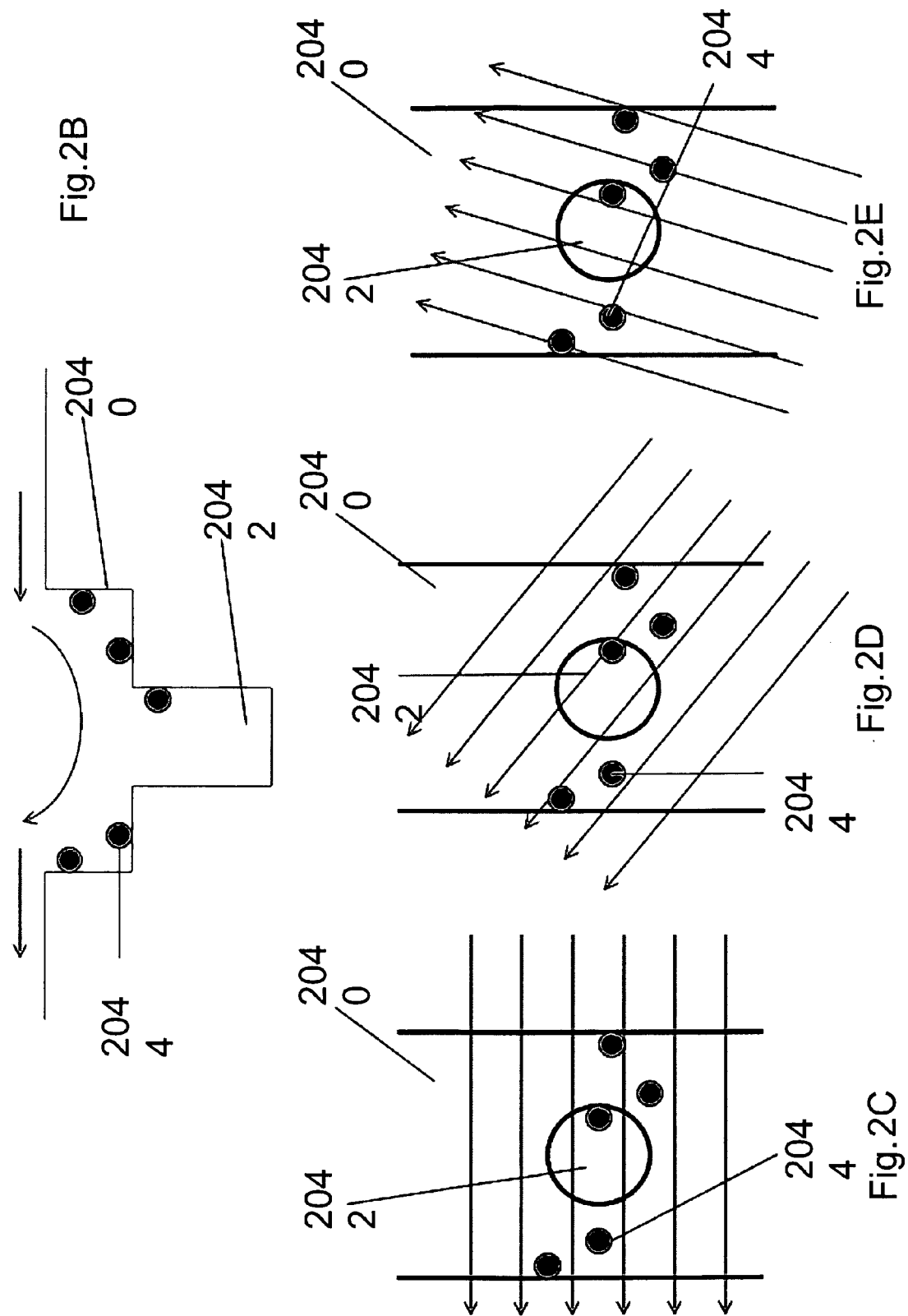

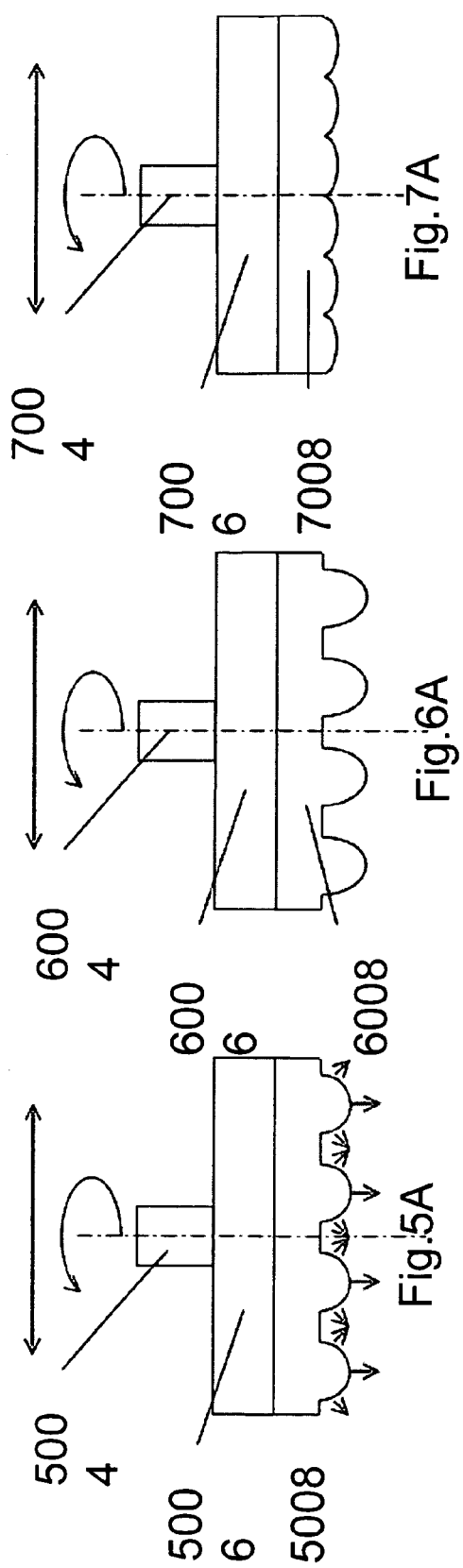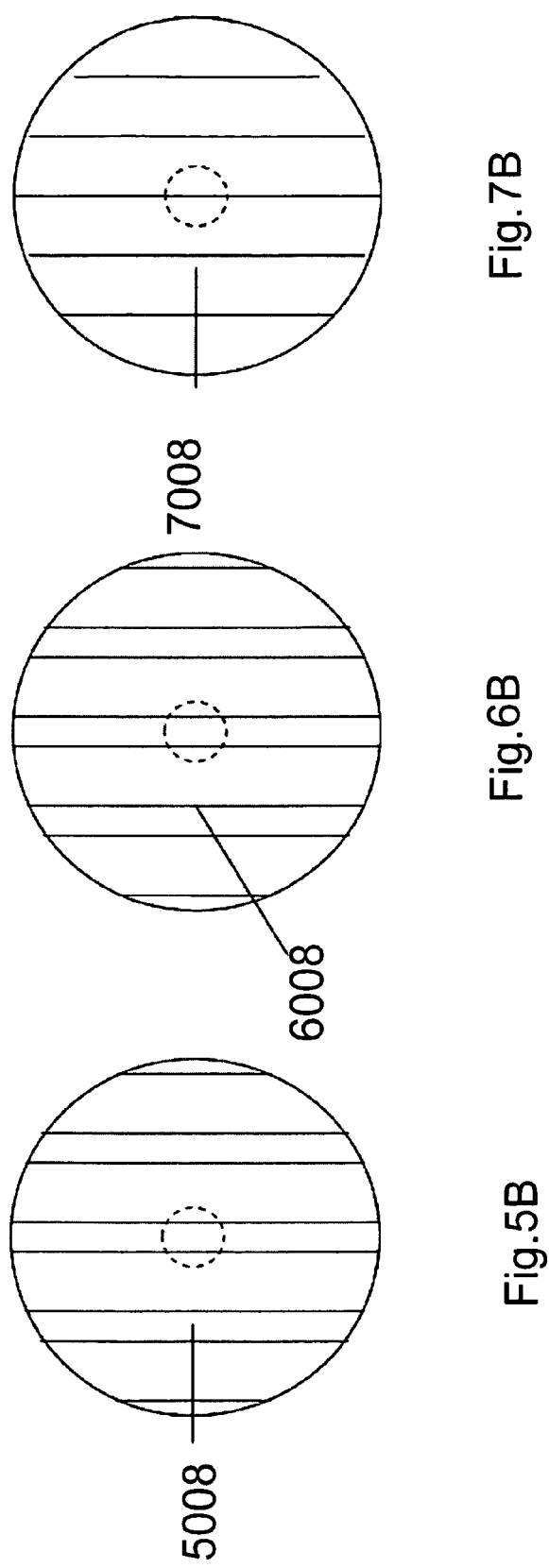

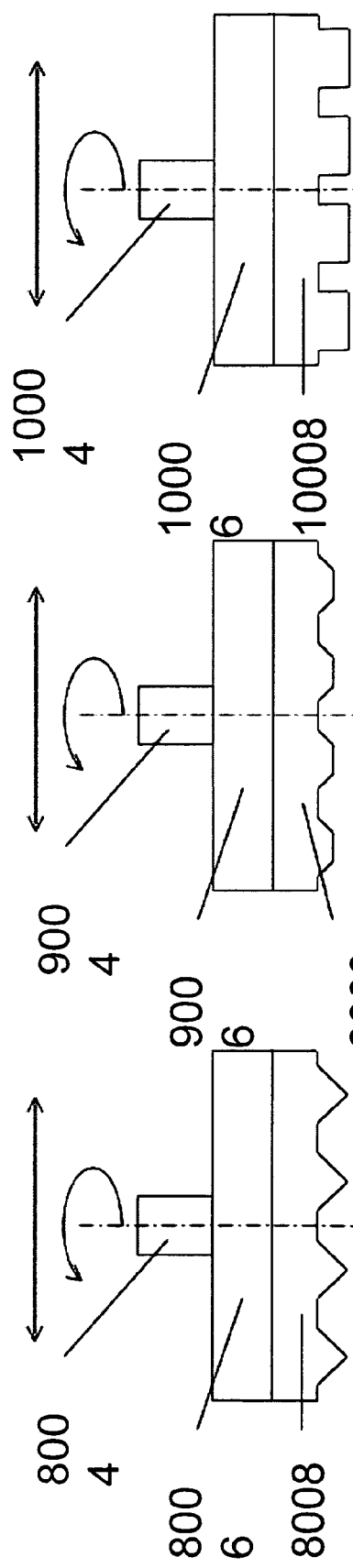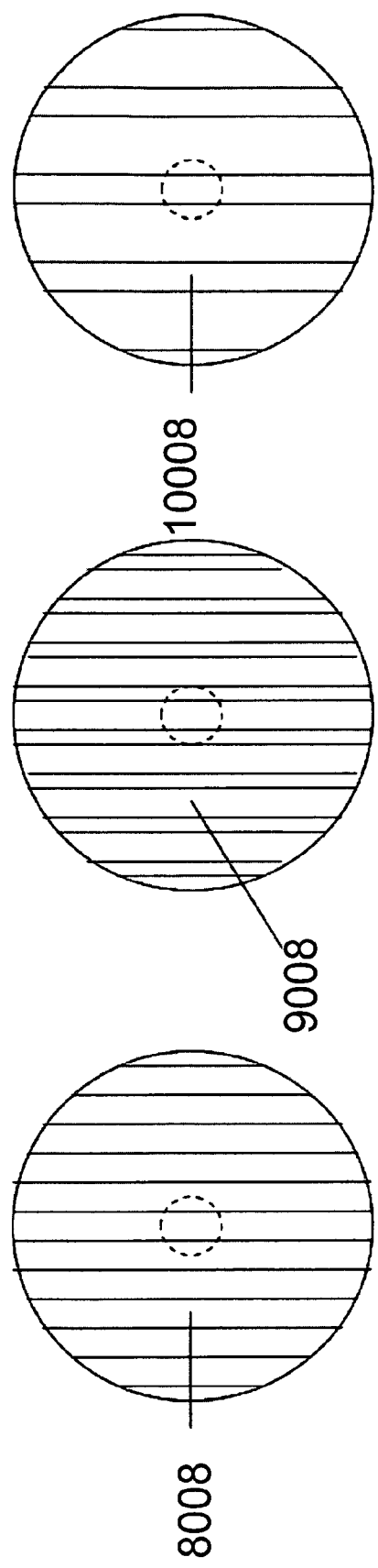

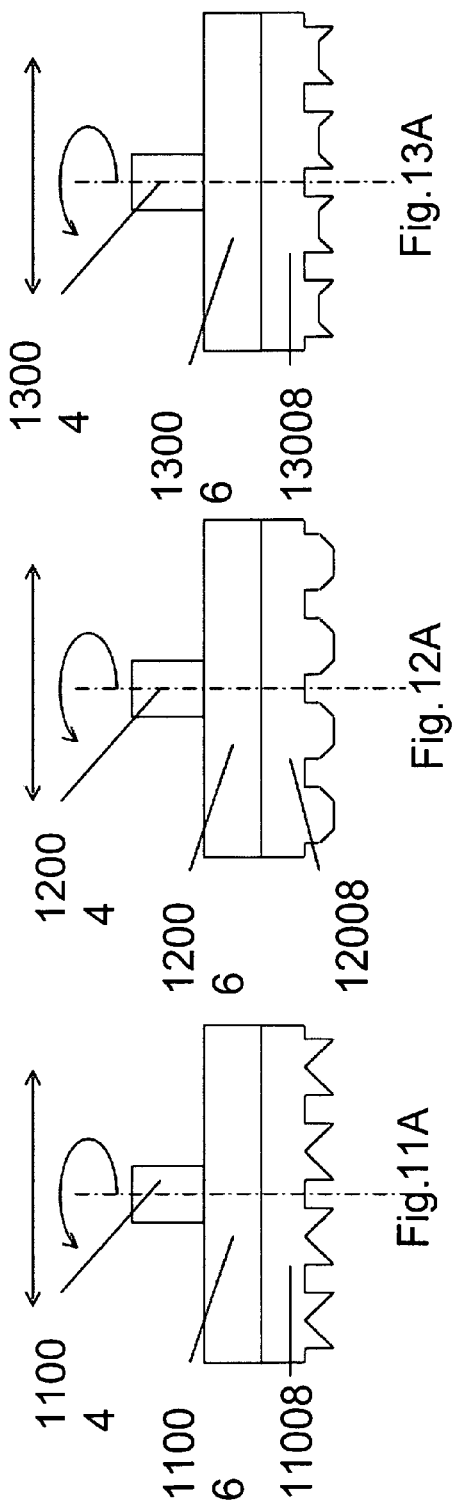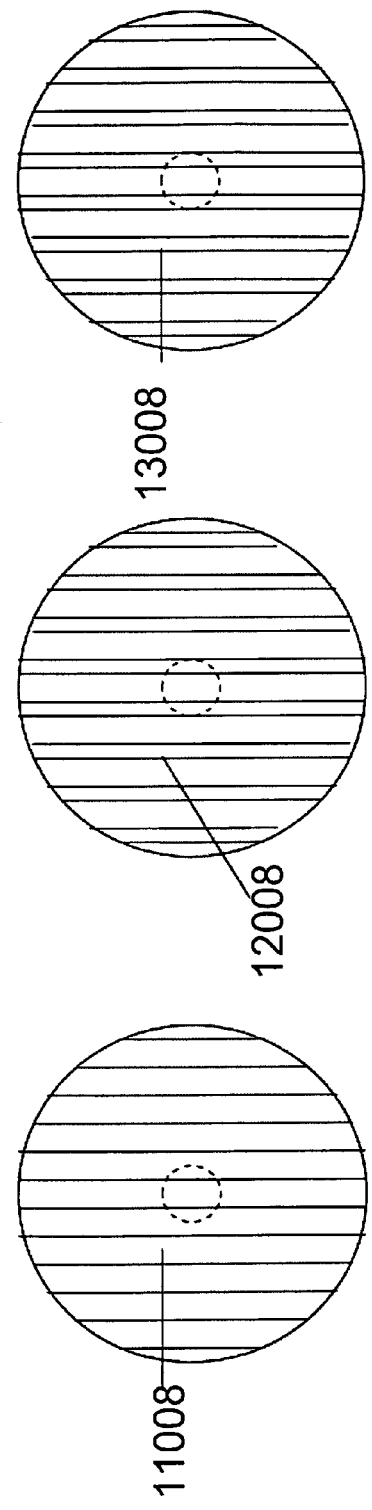

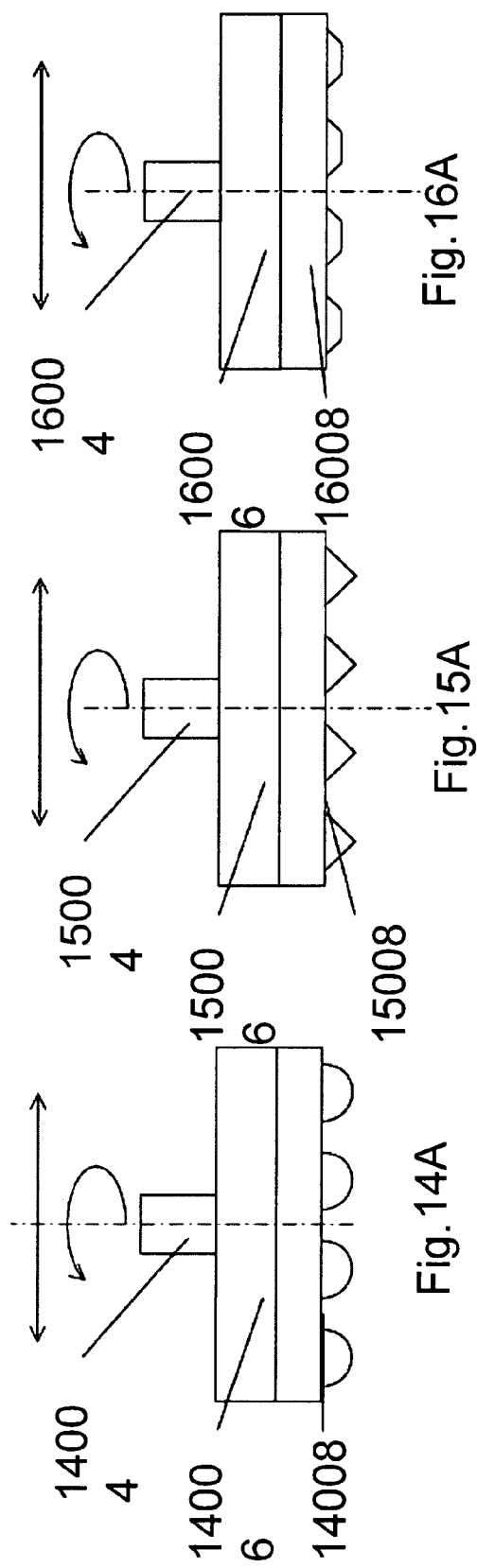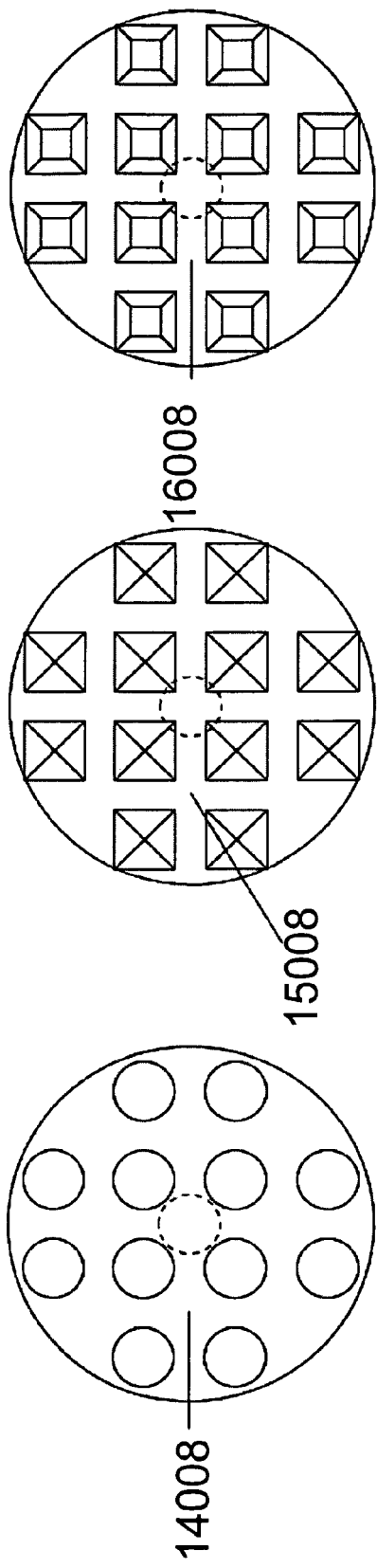

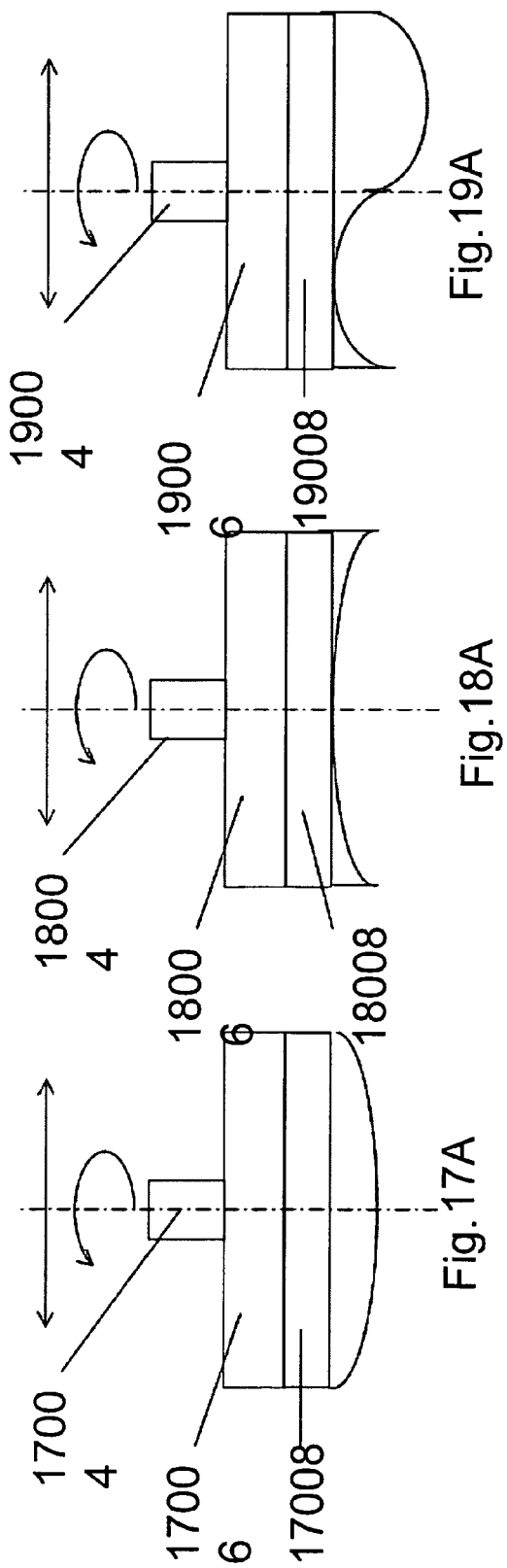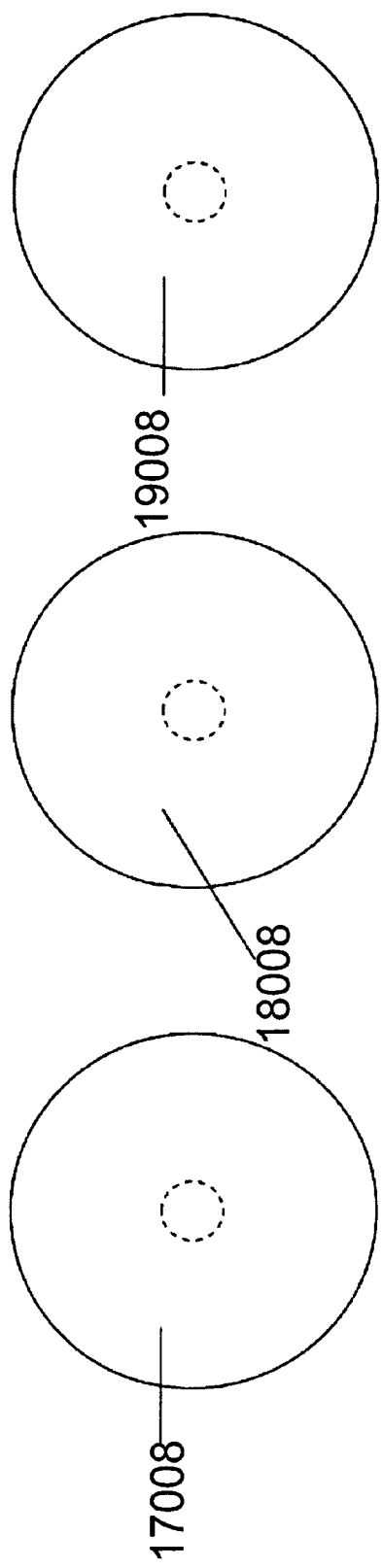

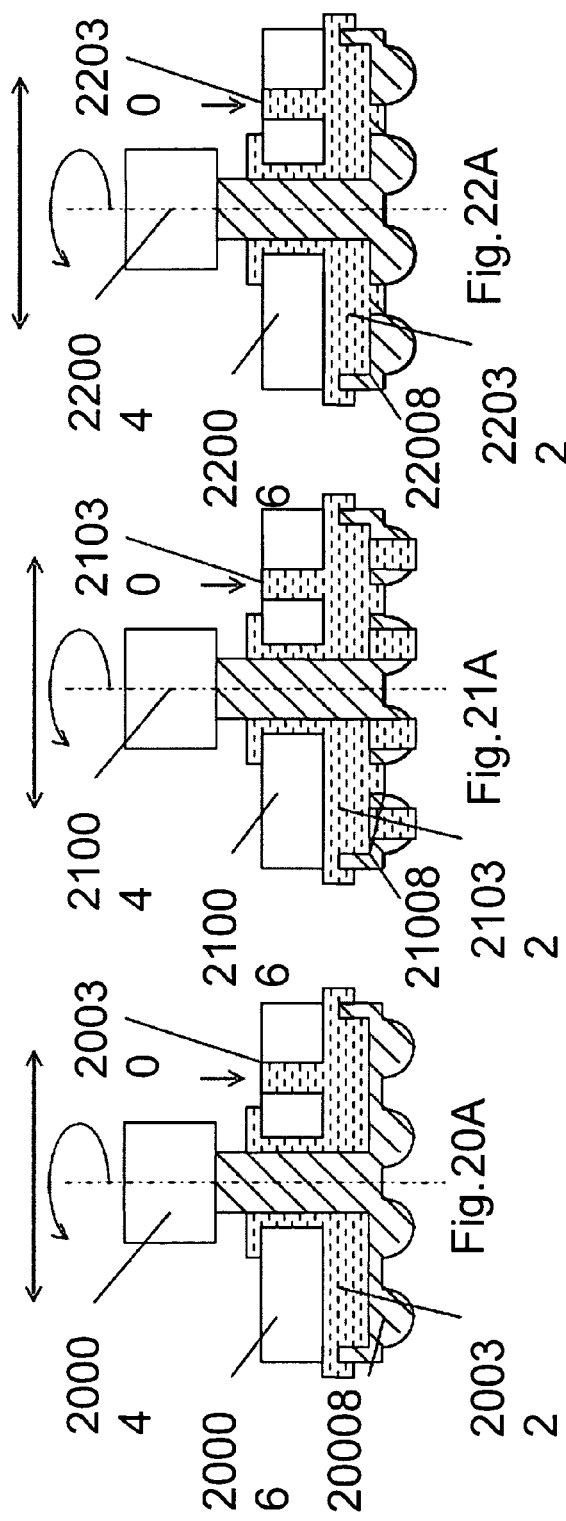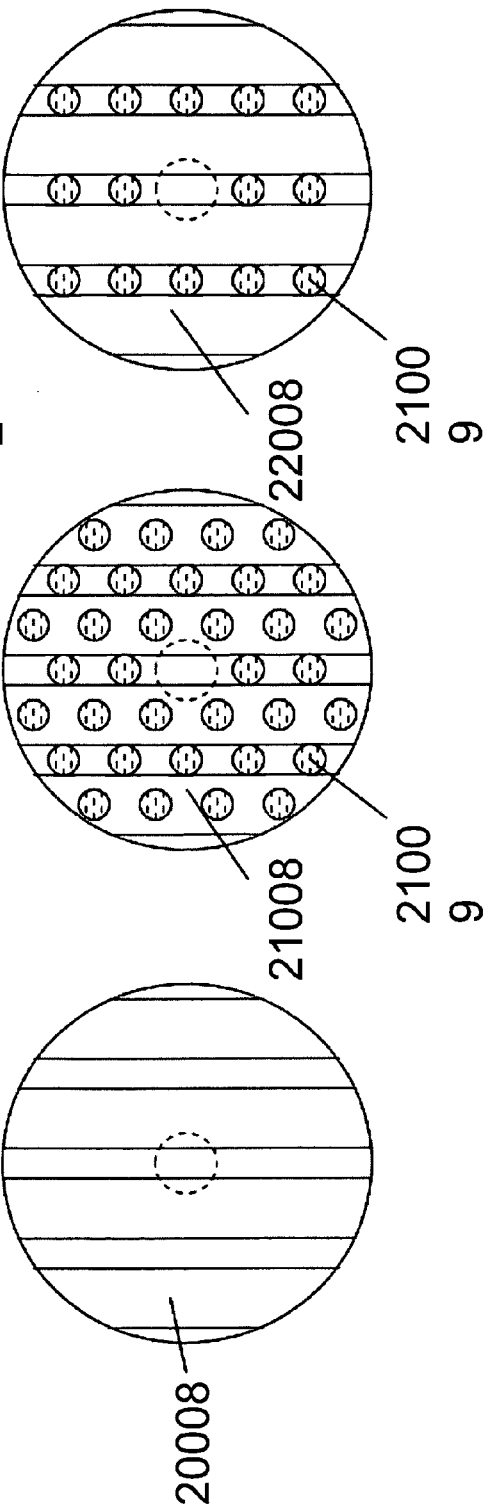

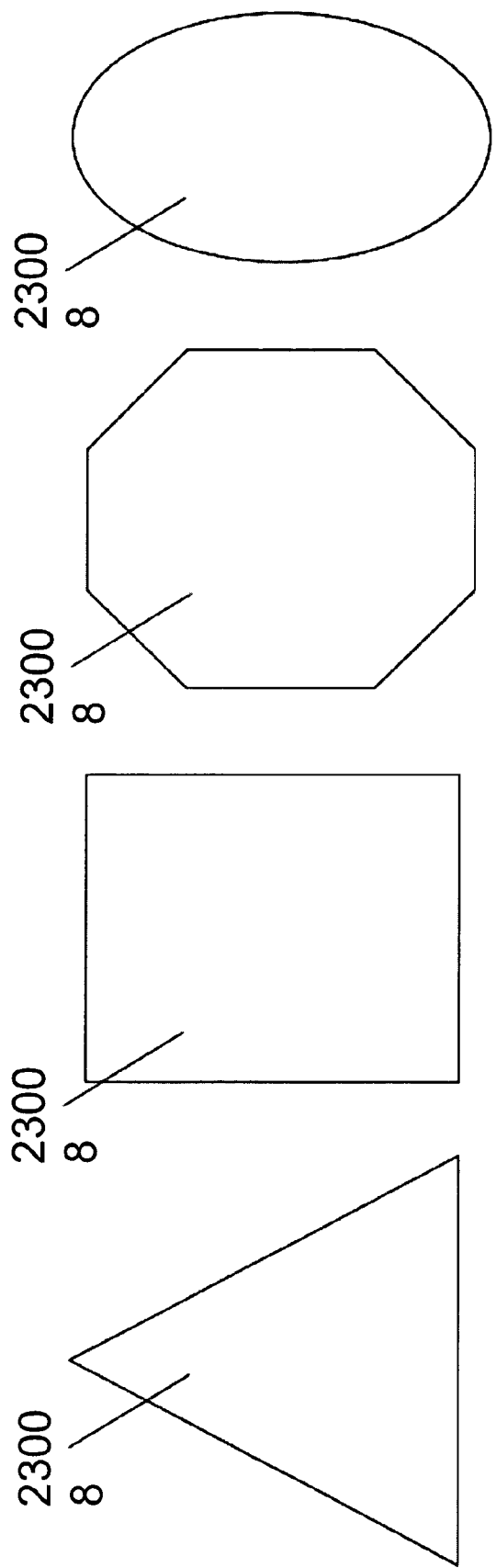

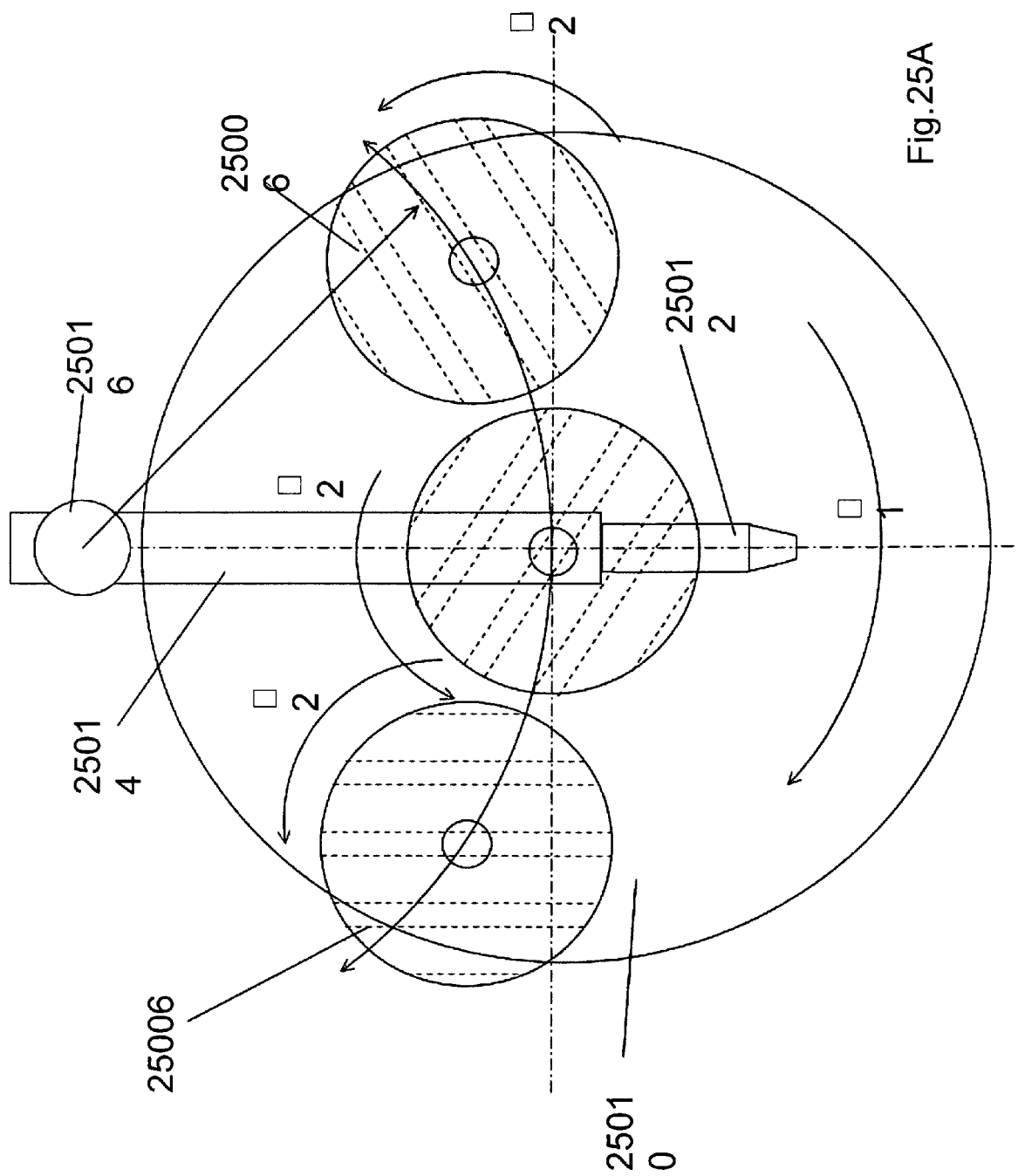

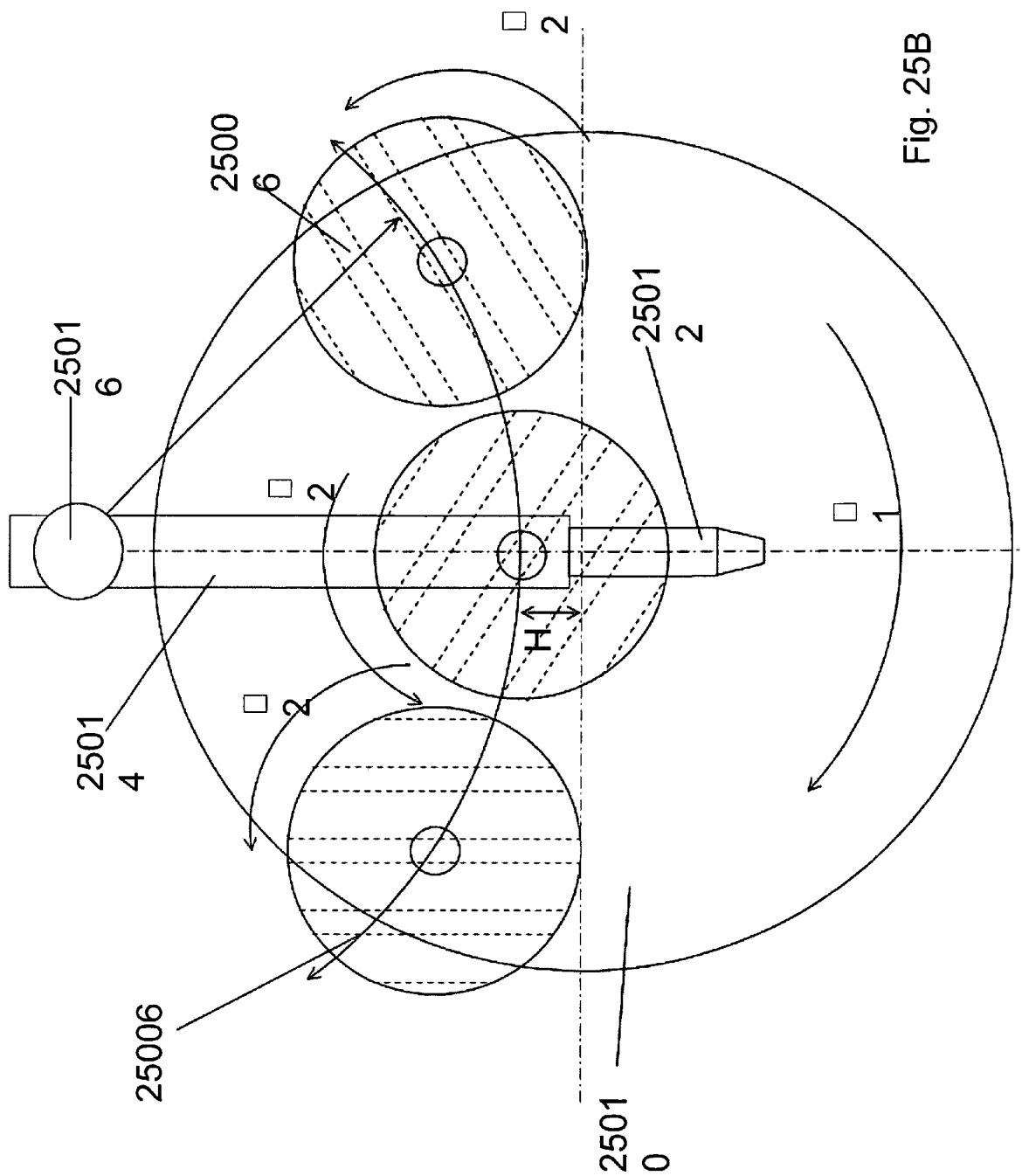

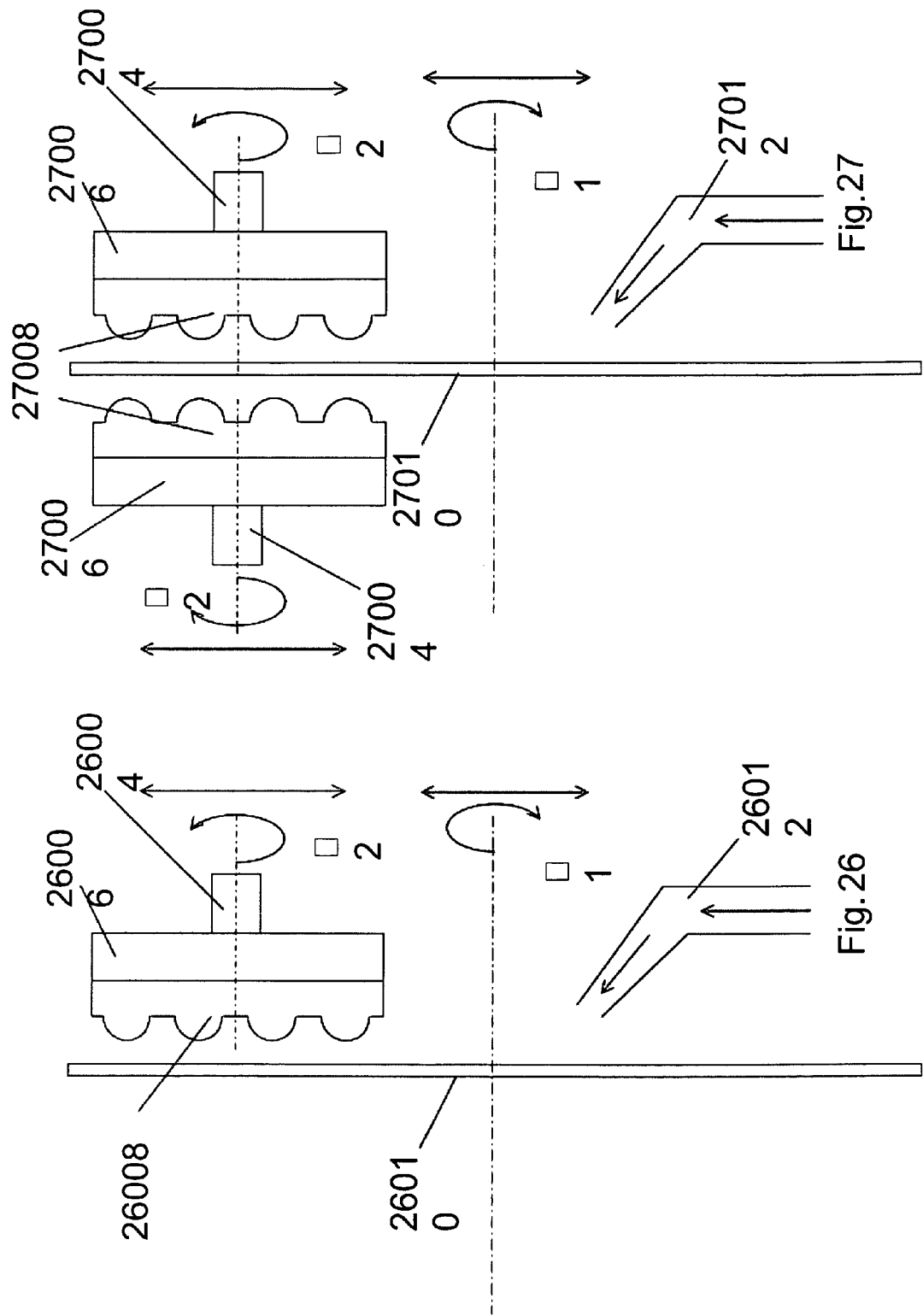

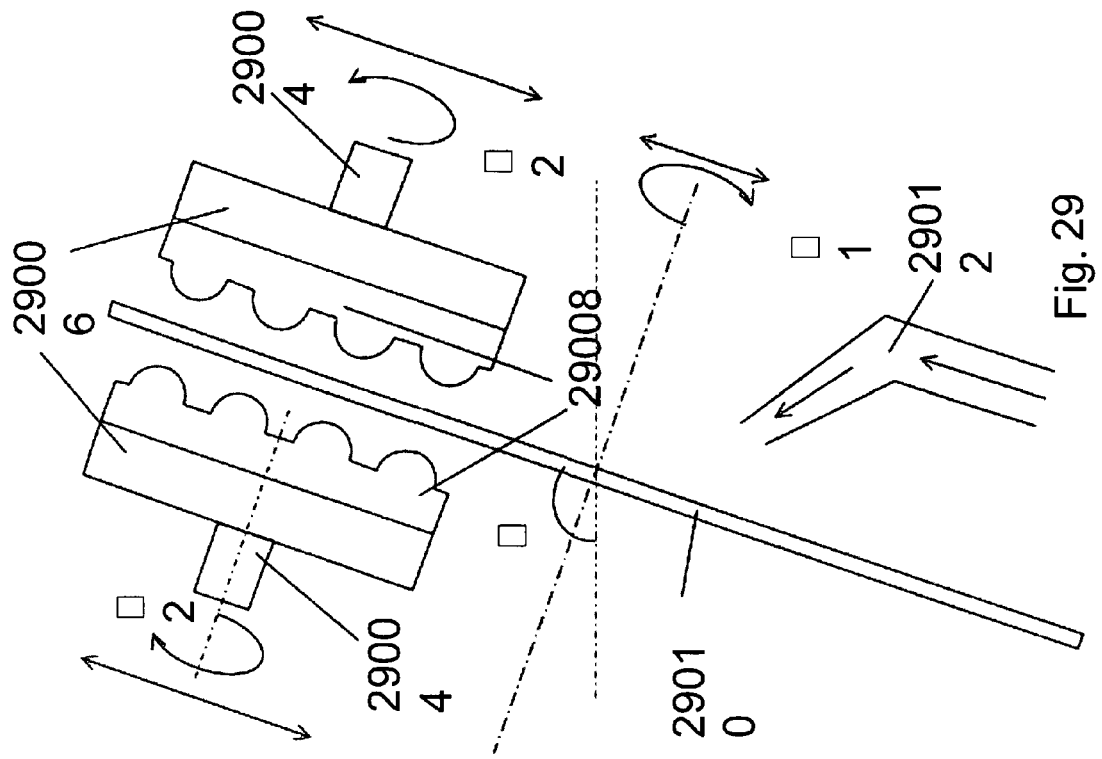
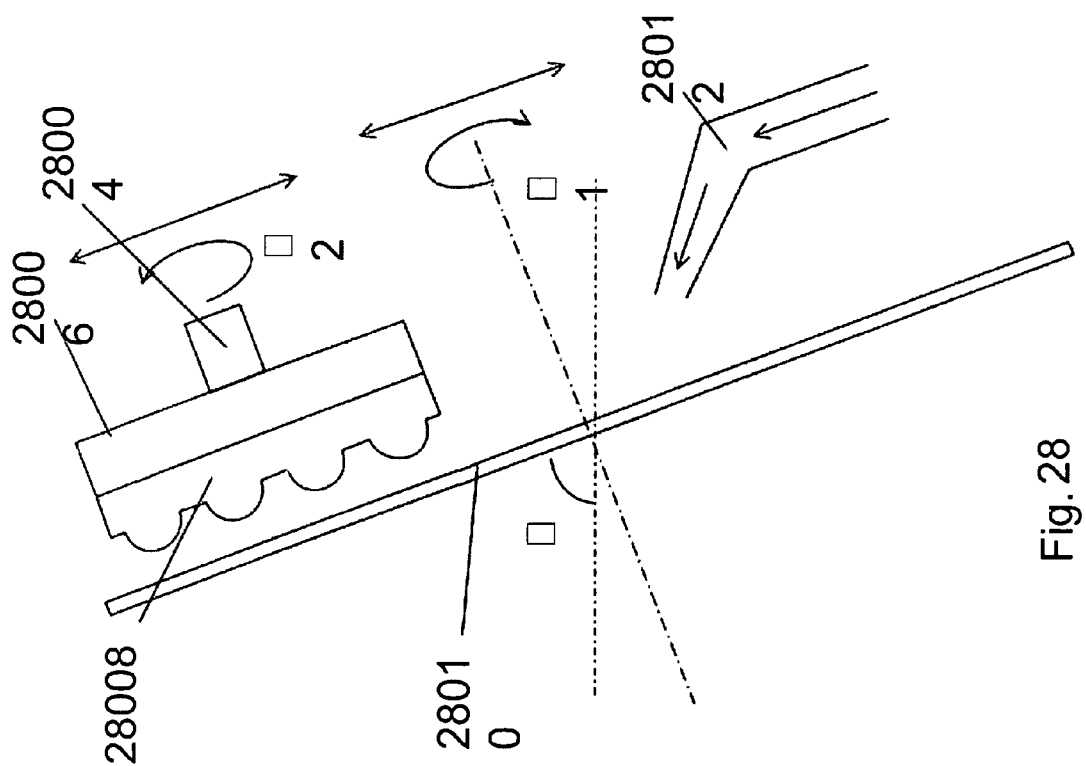

TABLE 35

| Rpm of plate is 90, fixed | | |
|---|---|---|
| Position along the radius of wafer, cm | Rpm of wafer | Radial velocity of plate, cm/s |
| 15 | 1.5 | 0.25 |
| 12 | 2.2 | 0.37 |
| 9 | 3.6 | 0.60 |
| 6 | 6.5 | 1.08 |
| 3 | 20.0 | 3.33 |

| Rpm of wafer is 3 and radial velocity of plate is 0.5 cm/s, fixed ||
|---|---|
| Position along the radius of wafer, cm | Rpm of plate |
| 15 | 180 |
| 12 | 120 |
| 9 | 75 |
| 6 | 40 |
| 3 | 15 |

TABLE 36

| Rpm of wafer | Translational velocity of plate, cm/s | Rpm of plate |
|---|---|---|
| 1 | 0.17 | 60 |
| 2 | 0.33 | 120 |
| 3 | 0.50 | 180 |
| 4 | 0.67 | 240 |
| 5 | 0.83 | 300 |
| 6 | 1.00 | 360 |
| 7 | 1.17 | 420 |
| 8 | 1.33 | 480 |
| 9 | 1.50 | 540 |
| 10 | 1.67 | 600 |

TABLE 37

METHODS AND APPARATUS FOR CLEANING SEMICONDUCTOR WAFERS

FIELD OF THE INVENTION

This application is a national stage entry of PCT/CN2007/070234, which was filed Jul. 5, 2007. The present invention generally relates to a method and apparatus for cleaning semiconductor wafer. More particularly, using rotation plate coupled with and without ultra sonic and mega sonic device to increase particle and contamination removal efficiency, and at the same time to realize minimum material loss in semiconductor wafer structure.

BACKGROUND OF THE INVENTION

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and plasma etching step can be performed to form a pattern of recessed areas in a dielectric layer on a semiconductor wafer that serve as trenches and vias for the interconnections. In order to removal particles and contaminations in trench and via post etching or photo resist ashing, a wet cleaning step is necessary. Especially, when device manufacture node migrating to 65 nm and beyond, the side wall loss in trench and via during is crucial for maintaining the critical dimension. In order to reduce or eliminating the side wall loss, it is important to use moderate, dilute chemicals, or sometime de-ionized wafer only. However, the dilute chemical or de-ionized water usually is not efficient to remove particle in the trench and via. Therefore the mechanical force such as ultra sonic or mega sonic is needed in order to remove those particles efficiently. Ultra sonic and mega sonic wave will apply mechanical force to wafer structure such as trenches and vias, the power intensity and power distribution is key parameters to control the mechanical force within the damage limit and at same time efficiently to remove the particles.

Mega sonic energy coupled with nozzle to clean semiconductor wafer is disclosed in U.S. Pat. No. 4,326,553. The fluid is pressurized and mega sonic energy is applied to the fluid by a mega sonic transducer. The nozzle is shaped to provide a ribbon-like jet of cleaning fluid vibrating at mega sonic frequencies for the impingement on the surface.

A source of energy vibrates an elongated probe which transmits the acoustic energy into the fluid is disclosed in U.S. Pat. No. 6,039,059. In one arrangement, fluid is sprayed onto both sides of a wafer while a probe is positioned close to an upper side. In another arrangement, a short probe is positioned with its end surface close to the surface, and the probe is moved over the surface as wafer rotates.

A source of energy vibrates a rod which rotates around it axis parallel to wafer surface is disclosed in U.S. Pat. No. 6,843,257 B2. The rod surface is etched to curve groves, such as spiral groove. It is needed to have a better cleaning method for cleaning particles and contamination on surface of wafer or substrate with higher efficiency and lower mechanical damages.

SUMMARY OF THE INVENTION

One embodiment of the present invention is to disclose a plate to be positioned close to surface of wafer or substrate. The plate is moveable parallel to surface of wafer or substrate. The plate is rotated around an axis vertical to surface of wafer or substrate.

Another embodiment of the present invention is to disclose plate vibrated by ultra sonic or mega sonic transducer. The plate is moveable parallel to surface of wafer or substrate. The plate is rotated around an axis vertical to surface of wafer or substrate.

Another embodiment of the present invention is to disclose a plate vibrated by ultra sonic or mega sonic transducer. The rotating plate surface facing surface of wafer or substrate has groves, regular patterns, and irregular patterns to enhance the cleaning efficiency. The plate is moveable parallel to surface of wafer or substrate. The plate is rotated around an axis vertical to surface of wafer or substrate.

Another embodiment of the present invention is to disclose a plate vibrated by ultra sonic or mega sonic transducer. The rotating plate has holes to deliver cleaning chemicals or de-ionized water to wafer surface. The plate is moveable parallel to surface of wafer or substrate. The plate is rotated around an axis vertical to surface of wafer or substrate.

BRIEF DESCRIPTION OF THE DRAWINGS

FIGS. 2A-2E depict an exemplary wafer cleaning process;
FIGS. 5A-5B depict another exemplary wafer cleaning device;
FIGS. 6A-6B depict another exemplary wafer cleaning device;
FIGS. 7A-7B depict another exemplary wafer cleaning device;
FIGS. 8A-8B depict another exemplary wafer cleaning device;
FIGS. 9A-9B depict another exemplary wafer cleaning device;
FIGS. 10A-10B depict another exemplary wafer cleaning device;
FIGS. 11A-11B depict another exemplary wafer cleaning device;
FIGS. 12A-12B depict another exemplary wafer cleaning device;
FIGS. 13A-13B depict another exemplary wafer cleaning device;
FIGS. 14A-14B depict another exemplary wafer cleaning device;
FIGS. 15A-15B depict another exemplary wafer cleaning device;
FIGS. 16A-16B depict another exemplary wafer cleaning device;
FIGS. 17A-17B depict another exemplary wafer cleaning device;
FIGS. 18A-18B depict another exemplary wafer cleaning device;
FIGS. 19A-19B depict another exemplary wafer cleaning device;

FIGS. 20A-20B depict another exemplary wafer cleaning device;

FIGS. 21A-21B depict another exemplary wafer cleaning device;

FIGS. 22A-22B depict another exemplary wafer cleaning device;

FIGS. 23A-23D depict another exemplary wafer cleaning device;

FIGS. 25A-25B depict another exemplary wafer cleaning device;

FIG. 26 depicts another exemplary wafer cleaning device;

FIG. 27 depicts another exemplary wafer cleaning device;

FIG. 28 depicts another exemplary wafer cleaning device;

FIG. 29 depicts another exemplary wafer cleaning device;

TABLE. 35 depicts example results of wafer rotation speed calculated using the algorithm in present invention;

TABLE. 36 depicts example results of plate rotation speed calculated using the algorithm in present invention;

TABLE. 37 depicts example results plate rotation speed calculated using the algorithm in present invention.

DETAILED DESCRIPTION OF THE INVENTION

Figure 1A:
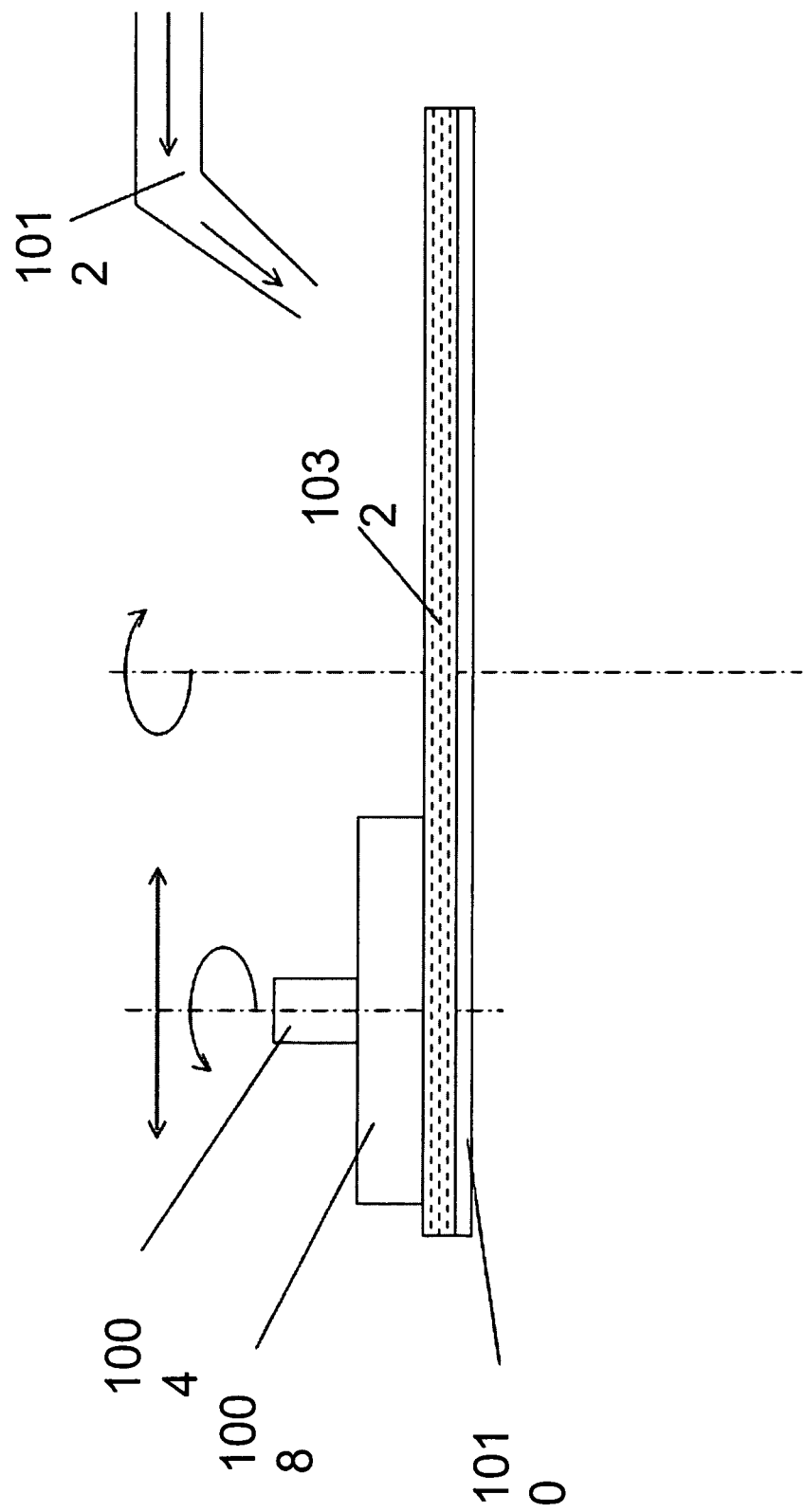
FIGS. 1A-B depict an exemplary wafer cleaning device.
Figure 1B:
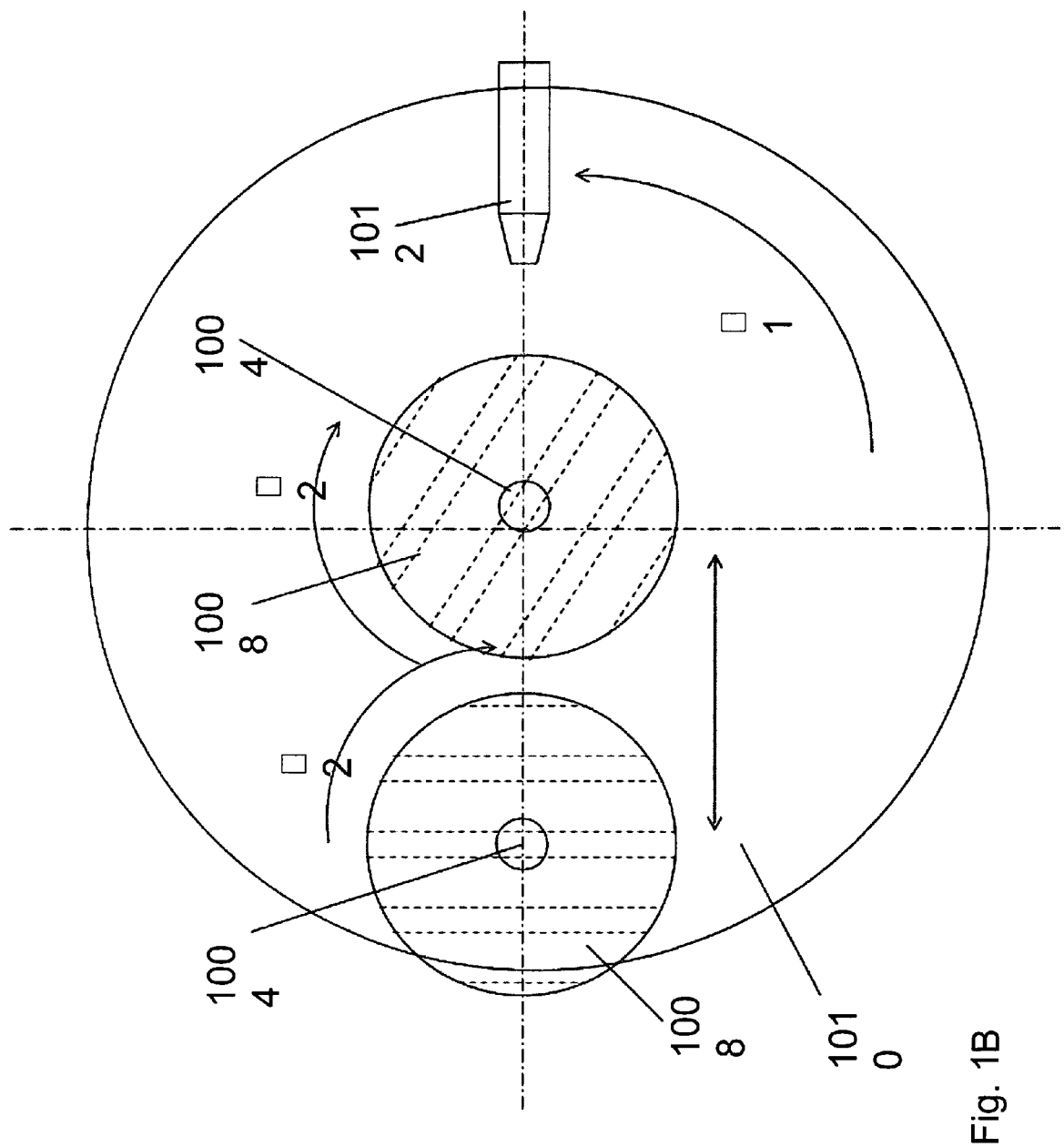

In one exemplary embodiment, FIGS. 1A to 1C show the detail of the wafer cleaning device using a rotating plate. The wafer cleaning device consists of wafer 1010, plate 1008 being rotated by rotation driving mechanism 1004, and nozzle 1012 delivering cleaning chemicals or de-ionized water 1032. Plate 1008 is placed parallel to surface of wafer 1010, and can be moved in direction parallel to surface of wafer 1010. The rotating plate will make chemical fluid between rotating plate 1008 and wafer 1010 be rotated, which will enhance the cleaning efficiency. The gap between rotating plate 1008 and wafer 1010 is in the range of 0.1 mm to 10 mm, preferred 2 mm. A detail description will be performed in FIG. 2A to 2E. During the cleaning process, wafer 1010 can be rotated around the wafer center at rotating speed 1, and plate 1004 is rotated at rotating speed of 2. Plate 1008 can move in lateral direction at a constant speed or changing speed, the lateral moving speed can be set high when rotating plate 1008 moves to position of wafer center, and can be set low when rotating plate 1008 moves to position of wafer edge. Rotating speed 1 of wafer 1010 can be constant speed or changing speed, the rotating speed 1 can be set high when rotating plate 1008 moves to a position of wafer center, and can be set low when rotating plate 1008 moves to a position of wafer edge.

Figure 2A:
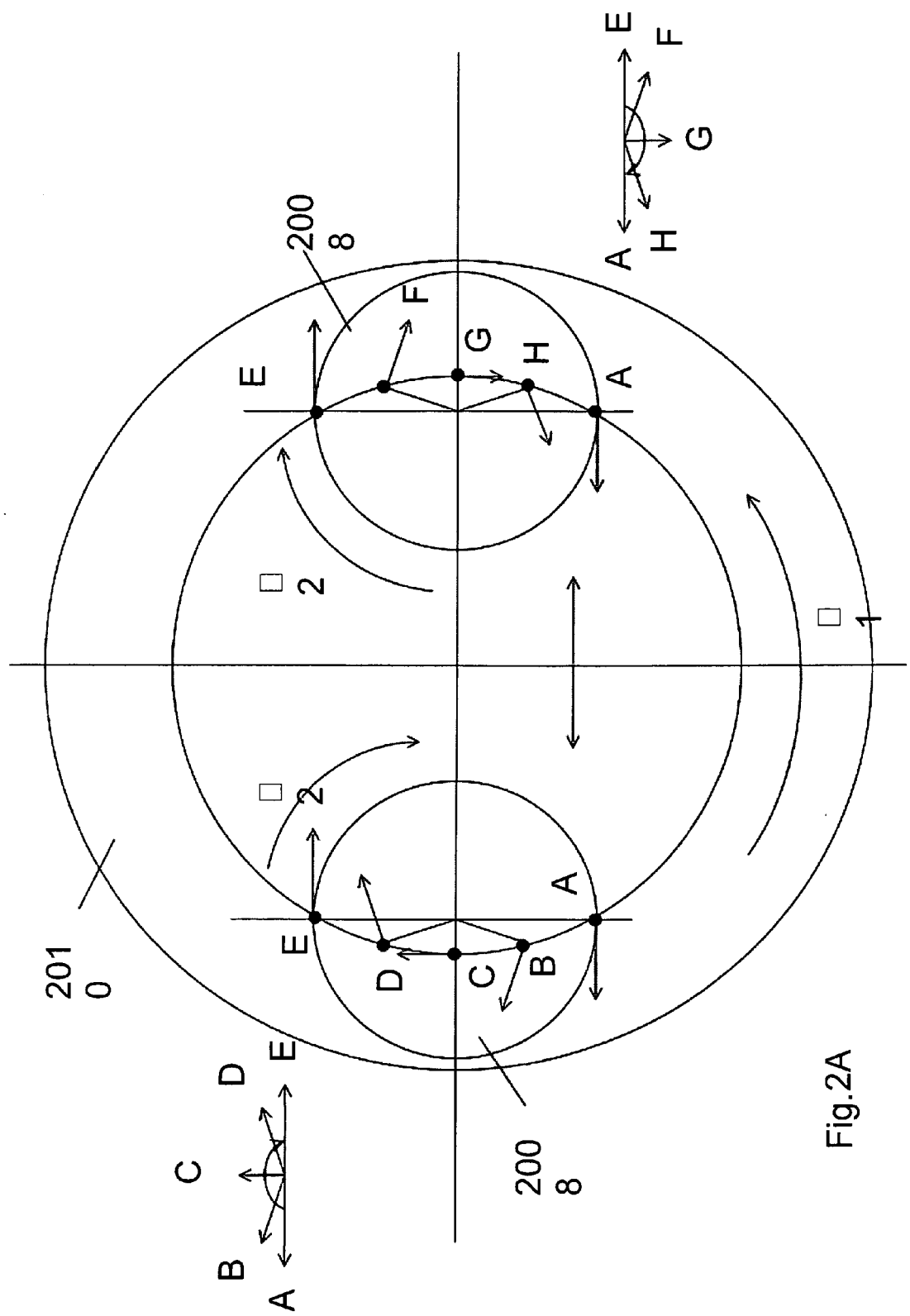

FIGS. 2A to 2E show the flow status of cleaning chemicals or fluid 1032 during cleaning process. As shown in FIG. 2A, when the same point at wafer moves from A to E, the direction of fluid passing the same point of wafer 2008 changes from A to B, C, D, and E, i.e. from 180 degree to 0 degree. In the same way, when the same point at wafer moves from E to A, the direction of fluid passing the same point of wafer 2008 changes from E to F, G, H, A, i.e. from 0 degree to 180 degrees. FIG. 2B shows that particles 2044 are located in trench 2040 and via 2042. When fluid direction changes as shown in FIG. 2C to 2E, the particles in trench and via will be more efficiently removed away.

Figure 3:
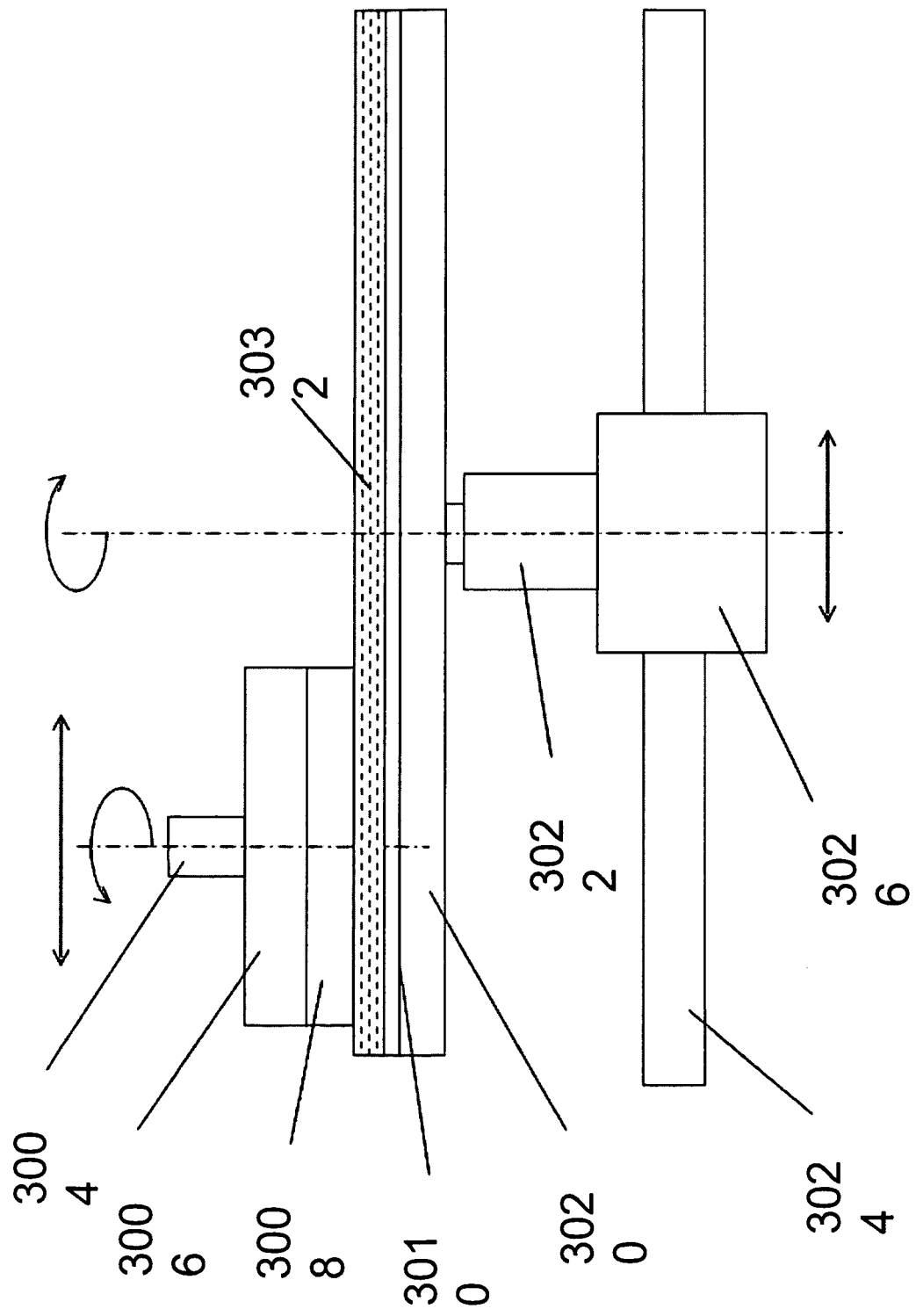
FIG. 3 depicts another exemplary wafer cleaning device.

One example of chemicals being used to remove the particle and contamination are shown as follows:
Organic Material Removal: $H_2SO_4:H_2O_2=4:1$
Particle Reduction: $NH_4OH:H_2O_2:H_2O=1:1:5$
Metal Contamination Removal: $HCl:H_2O_2:H_2O=1:1:6$
Oxide Removal: Oxide Removal=$HF:H_2O=1:100$ FIG. 3 shows another embodiment of wafer cleaning device using a rotating plate according to the present invention. The embodiment is similar to that shown in FIGS. 1A and 1B, except that wafer 3010 is hold by laterally movable chuck 3020, and a ultra sonic or mega sonic transducer 3006 is attached above rotating plate 3008. Chuck 3020 can be rotated by driving mechanism 3022, and laterally moved by moving mechanism 3026 and guider 3024. Guide 3024 can straight guider, or curved guider. Ultra sonic or mega sonic device is used to generate mechanical vibrating energy, which is further transmitted to wafer surface through rotating plate 3008 and chemical fluid 3032. Transducer 3006 needs electrical brushes to feed in and out electrical current to driving transducer itself since transducer 3006 is in rotation status during cleaning process. The frequency of transducer can be set at ultra sonic range and mega sonic range, depending on the particle to be cleaned. The larger the particle size is, the lower frequency should be used. Ultra sonic range is from 20 kHz to 200 kHz, and mega sonic range is from 200 kHz to 10 MHz. Also frequency of mechanical wave can be alternated either one at a time in succession or concurrently in order to clean different size of particles on the same substrate or wafer.

Figure 4:
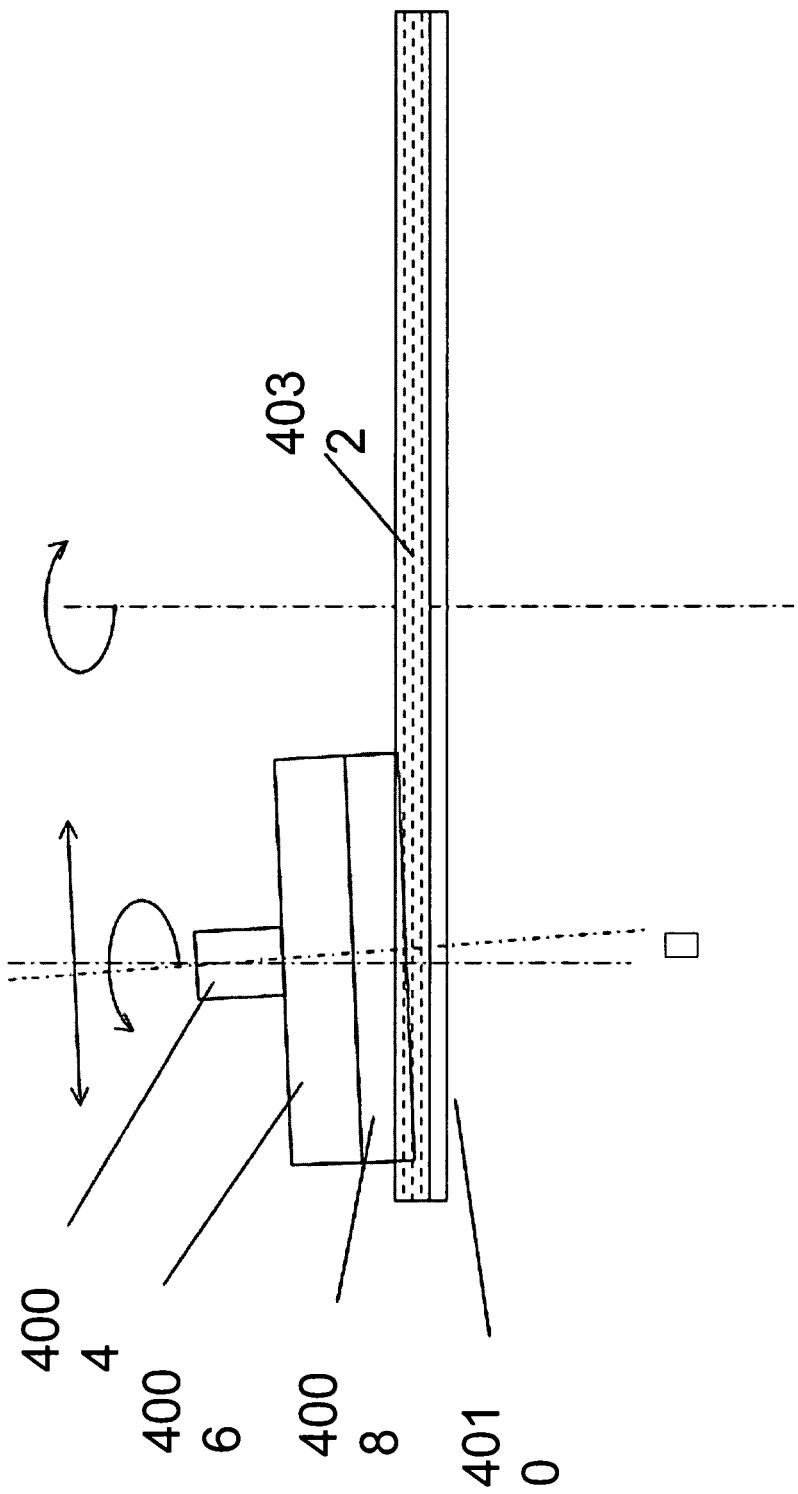
FIG. 4 depicts another exemplary wafer cleaning device.

FIG. 4 shows another embodiment of wafer cleaning device using a rotating plate. The embodiment is similar to that shown in FIGS. 1A and 1B, except that rotating plate 4008 is placed not fully parallel to wafer surface, instead, having an angle of. Angle is in the range of 0 to 15 degrees.

FIG. 5A to 5B shows detail of embodiment of rotating plate and ultra sonic or mega sonic device according to the present invention. Rotating plate described in FIG. 1A and FIG. 3 is a plane. However, the rotating plate can be shaped in multiple half columns as shown in FIGS. 5A and 5B. The mechanical wave transmitted by surface of half column is diverged in different angle as shown in FIG. 5A. Such diverged mechanical wave is more efficient to separate particles from trench wall or via wall. Since half cycle column on rotating plate 5008 changes the orientation angle as plate 5008 rotating, the mechanical wave pattern changes the direction in 360 degrees in one turn of rotation, which will further enhance the cleaning efficiency with less ultra sonic or mega sonic energy, therefore less damage to device structure. At the same time, the multiple half cycle columns will further enhance the chemical fluid 1032 moving in spiral direction, which creates higher surface speed of fluid over surface of wafer 1010. In summary, the present invention create three effects during cleaning process:
1) half cycle column structure on rotating plate 5008 create diverged ultra sonic or mega sonic wave;
2) such diverged mechanical wave pattern further rotate around the rotation axis of rotating plate 5008;
3) fluid moves around the rotation axis of rotating plate 5008.

FIGS. 6A and 6B show another embodiment of wafer cleaning device using a rotating plate according to the present invention. The embodiment is similar to that shown in FIGS. 5A and 5B, except that columns on rotating plate 6008 are elliptical columns instead of half cycle columns.

FIGS. 7A and 7B show another embodiment of wafer cleaning device using a rotating plate according to the present invention. The embodiment is similar to that shown in FIGS. 5A and 5B, except that columns on rotating plate 7008 are less half cycle columns instead of half cycle columns.

FIGS. 8A and 8B show another embodiment of wafer cleaning device using a rotating plate according to the present invention. The embodiment is similar to that shown in FIGS. 5A and 5B, except that columns on rotating plate 8008 are triangular columns instead of half cycle columns.

FIGS. 9A and 9B show another embodiment of wafer cleaning device using a rotating plate according to the present invention. The embodiment is similar to that shown in FIGS. 5A and 5B, except that columns on rotating plate 9008 are trapezoid columns instead of half cycle columns.

FIGS. 10A and 10B show another embodiment of wafer cleaning device using a rotating plate according to the present invention. The embodiment is similar to that shown in FIGS. 5A and 5B, except that columns on rotating plate 10008 are rectangular columns instead of half cycle columns.

FIGS. 11A and 11B show another embodiment of wafer cleaning device using a rotating plate according to the present invention. The embodiment is similar to that shown in FIGS. 5A and 5B, except that columns on rotating plate 11008 are double triangular columns instead of half cycle columns.

FIGS. 12A and 12B show another embodiment of wafer cleaning device using a rotating plate according to the present invention. The embodiment is similar to that shown in FIGS. 5A and 5B, except that columns on rotating plate 12008 are half octagon columns instead of half cycle columns.

FIGS. 13A and 13B show another embodiment of wafer cleaning device using a rotating plate according to the present invention. The embodiment is similar to that shown in FIGS. 5A and 5B, except that columns on rotating plate 13008 are saddle columns instead of half cycle columns.

FIGS. 14A and 14B show another embodiment of wafer cleaning device using a rotating plate according to the present invention. The embodiment is similar to that shown in FIGS. 5A and 5B, except that patterns on rotating plate are individual half spheres instead of grooved half cycle columns.

FIGS. 15A and 15B show another embodiment of wafer cleaning device using a rotating plate according to the present invention. The embodiment is similar to that shown in FIGS. 14A and 14B, except that patterns on rotating plate are individual pyramids instead of individual half spheres.

FIGS. 16A and 16B show another embodiment of wafer cleaning device using a rotating plate according to the present invention. The embodiment is similar to that shown in FIGS. 14A and 14B, except that patterns on rotating plate are half pyramids instead of individual half spheres.

FIGS. 17A and 17B show another embodiment of wafer cleaning device using a rotating plate according to the present invention. The pattern on rotating plate 17008 is single convex column.

FIGS. 18A and 18B show another embodiment of wafer cleaning device using a rotating plate according to the present invention. The pattern on rotating plate 18008 is single concave column.

FIGS. 19A and 19B show another embodiment of wafer cleaning device using a rotating plate according to the present invention. The pattern on rotating plate 19008 is one convex column and one concave column.

FIGS. 20A and 20B show another embodiment of wafer cleaning device using a rotating plate according to the present invention. It consists of rotating plate 20008, static positioned ultra sonic or mega sonic transducer 20006, and driving mechanism 20004 driving rotating plate 20008. There is hole 20030 on transducer 20006 for introducing chemical fluid or de-ionized water 20032. The chemical fluid or de-ionized water 20032 is further flowed out through gap between rotating plate 20008 and transducer 20006 to reach surface of wafer underneath. Ultra sonic or mega sonic energy is transmitted from transducer 20006 through chemical fluid 20032, rotating plate 20008, and chemical fluid 1032 to reach surface of wafer 1010. The advantage of this embodiment is that transducer 20006 stays static, and therefore does not need electrical brushes to feed in and out electrical current to drive transducer 20006. Pattern on rotating plate 20032 are formed by multiple half cycle columns.

FIGS. 21A and 21B show another embodiment of wafer cleaning device using a rotating plate according to the present invention. The embodiment is similar to that shown in FIGS. 20A and 20B, except that there are through holes 21009 distributed on half cycle columns in rotating plate 21008. The function of holes 21009 is to feed chemical fluid 21032 to wafer surface underneath.

FIGS. 22A and 22B show another embodiment of wafer cleaning device using a rotating plate according to the present invention. The embodiment is similar to that shown in FIGS. 20A and 20B, except that there are through holes 22009 distributed on grooves between half cycle columns in rotating plate 22008. The function of holes 22009 is to feed chemical fluid 22032 to wafer surface underneath.

The shape of rotating plate shown in above embodiments is cycle. However, the contour of rotating plate can be triangle as shown in FIG. 23A, and can be square as shown in FIG. 23B, eight-angle as shown in FIG. 23C, and elliptical as shown in FIG. 23D.

Figure 24A:
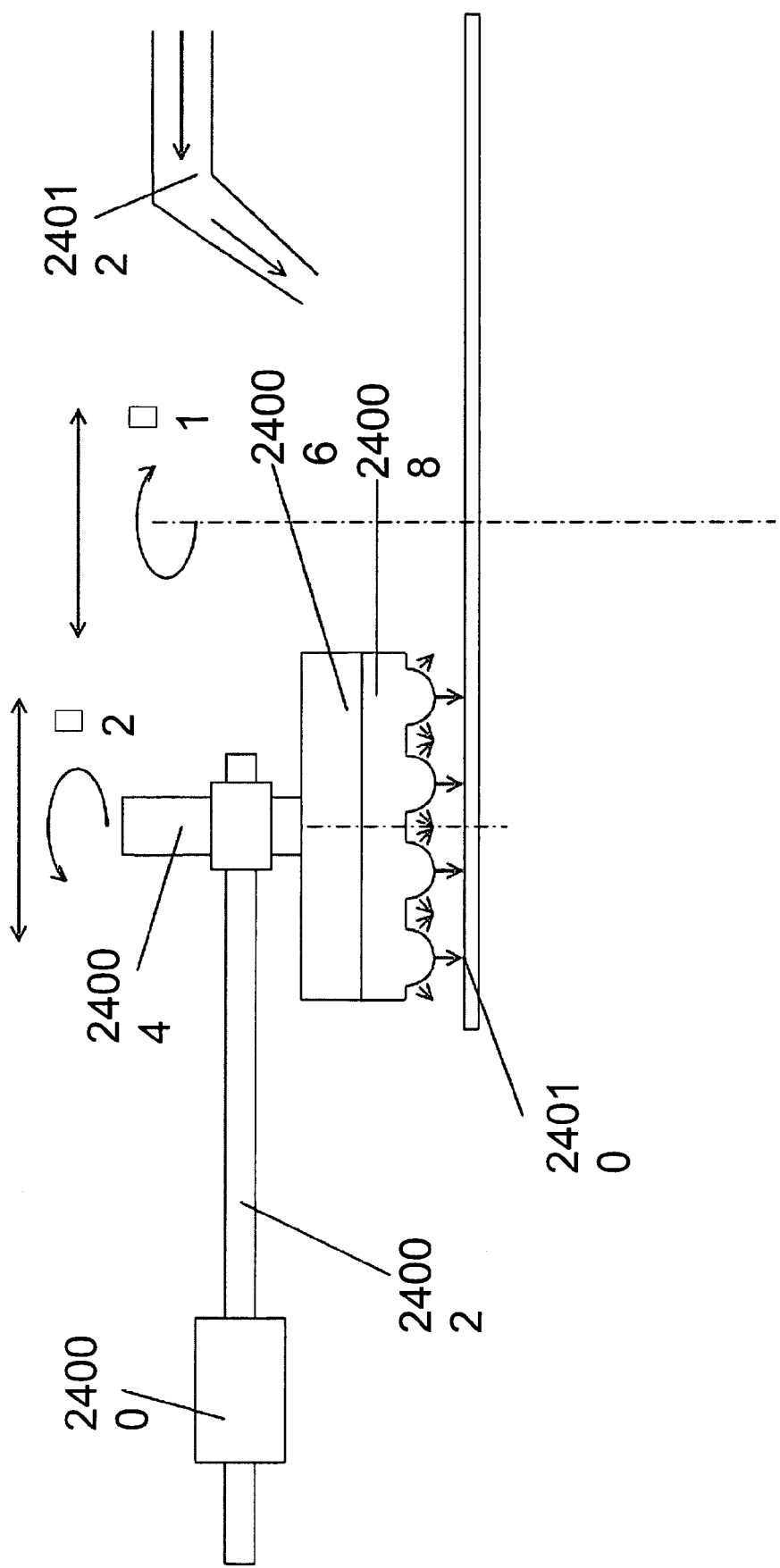
FIGS. 24A-24C depict another exemplary wafer cleaning device.
Figure 24B:
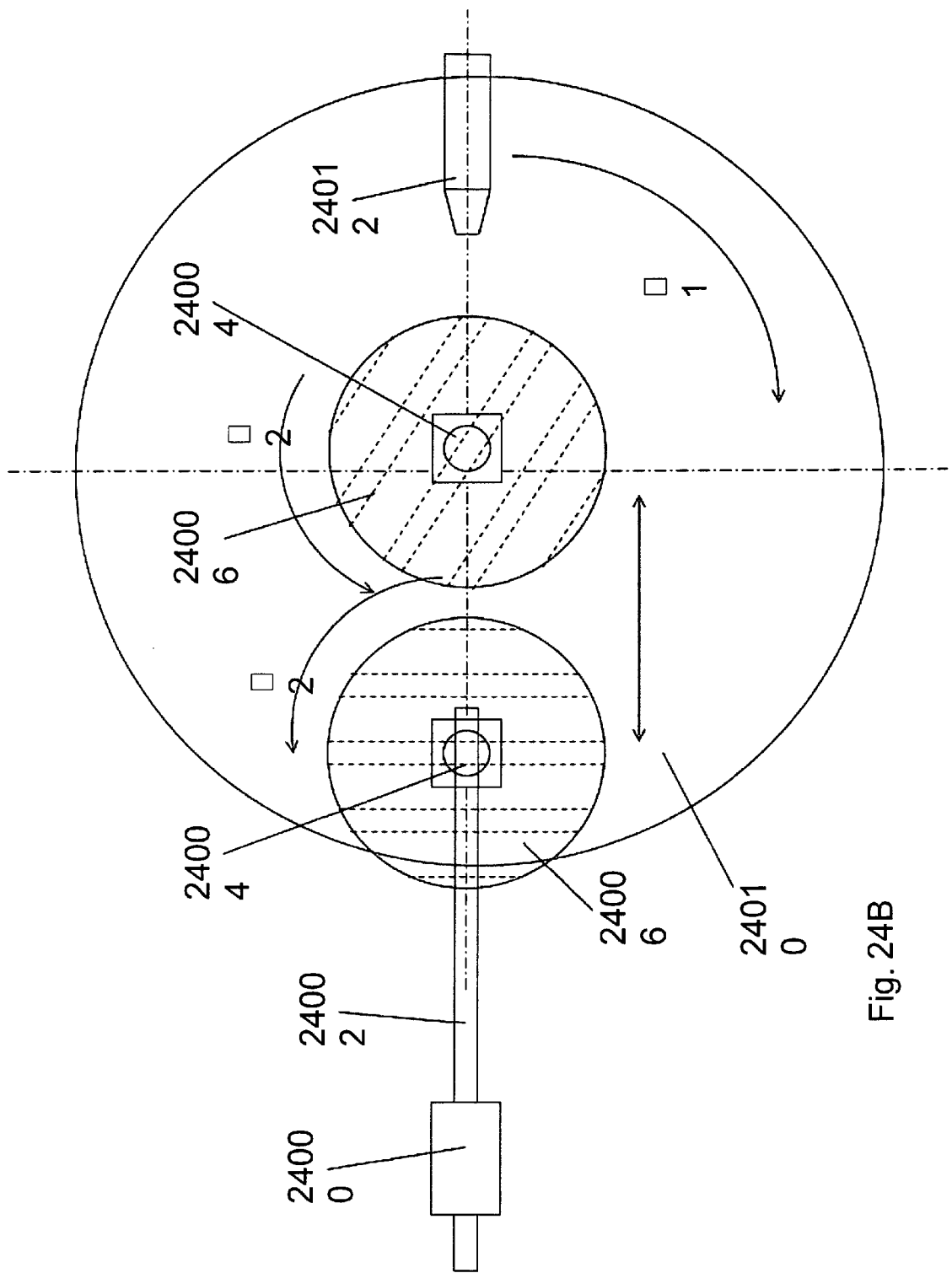
Figure 24C:
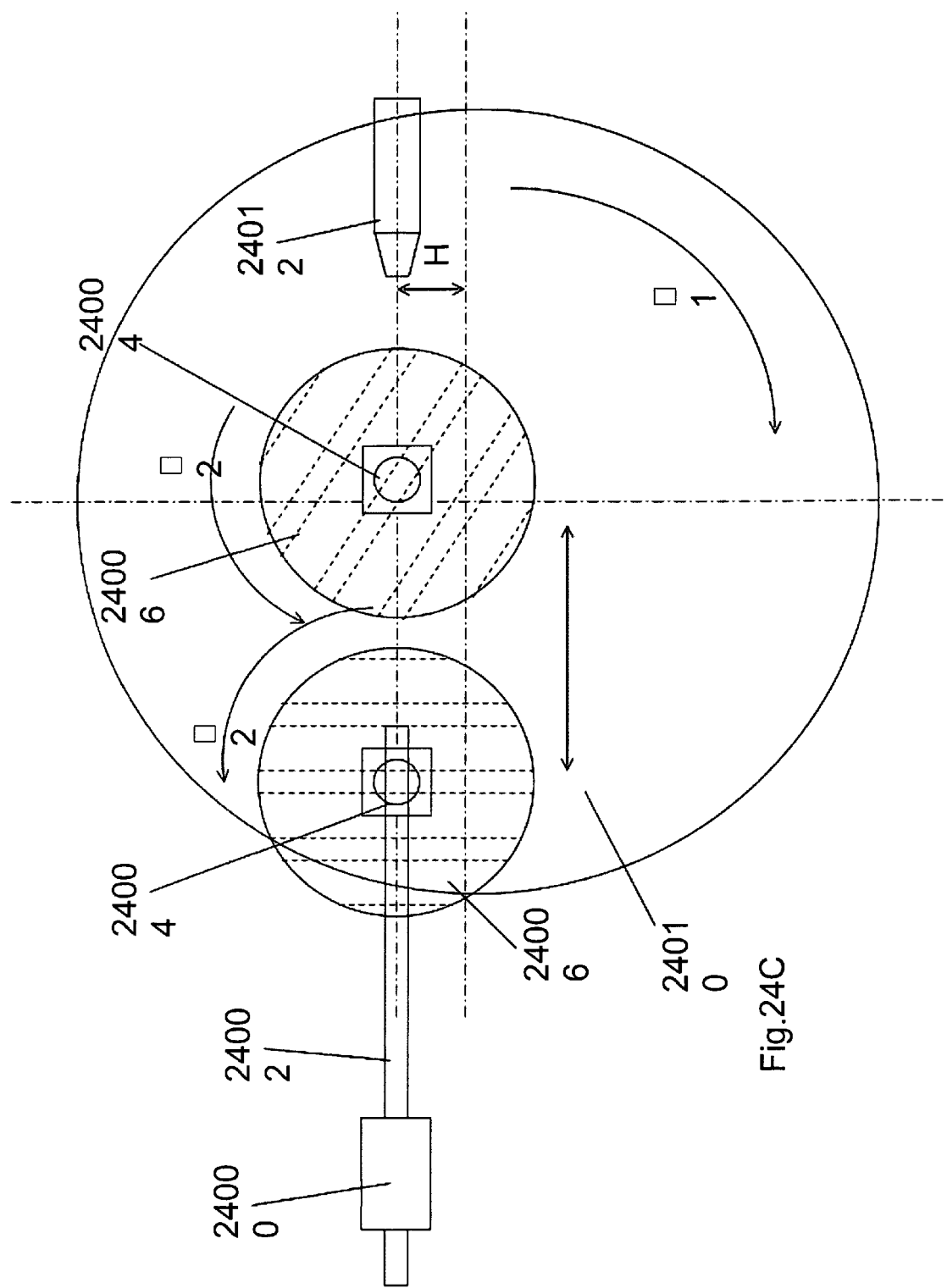

FIGS. 24A and 24C show another embodiment of wafer cleaning device using a rotating plate according to the present invention. It consists of rotating plate 24008, static positioned ultra sonic or mega sonic transducer 24006, driving mechanism 24004 driving rotating plate 24008, lateral moving guide 24002, lateral driving mechanism 24000, and nozzle 24012 for delivering chemical fluid. Transducer 24006 and rotation plate 24008 are droved in lateral direction back and forth across center of wafer 24010 by lateral driving mechanism 24000 as shown in FIG. 24B, and droved in lateral direction back and forth on a trajectory offset H from center of wafer 24010 by lateral driving mechanism 24000 as shown in FIG. 24C.

FIGS. 25A and 25B show another embodiment of wafer cleaning device using a rotating plate according to the present invention. It consists of rotating plate 25008, static positioned ultra sonic or mega sonic transducer 25006, driving mechanism 25004 driving rotating plate 25008, swing moving beam 25014, swing driving mechanism 25016, and nozzle 25012 for delivering chemical fluid. Transducer 25006 and rotation plate 25008 are swung left and right across center of wafer 25010 by swing driving mechanism 25016 as shown in FIG. 25B, and swung in left and right on a curve offset H from center of wafer 25010 by swing driving mechanism 25016 as shown in FIG. 25C. Nozzle 25012 are attached on swing beam 25014, therefore nozzle is swung together with transducer 25006. By this arrangement, chemicals can be constantly delivered to gap between rotating plate 25008 and wafer even the rotation plate 25008 is swung left and right.

FIG. 26 shows another embodiment of wafer cleaning device using a rotating plate according the present invention. The embodiment is similar to those shown in FIG. 24A to 24C and FIG. 25A to 25B, except that wafer 26010 and rotating plate 26008 are configured in vertical direction.

FIG. 27 shows another embodiment of wafer cleaning device using a rotating plate according the present invention. The embodiment is similar to those shown in FIG. 26, except that two set of cleaning devices are positioned on front side and backside of wafer simultaneously.

FIG. 28 shows another embodiment of wafer cleaning device using a rotating plate according the present invention. The embodiment is similar to those shown in FIG. 26, except that wafer 28010 and cleaning device are set at angle β. Angle β is set from 90 degree to 180 degree.

FIG. 29 shows another embodiment of wafer cleaning device using a rotating plate according the present invention. The embodiment is similar to those shown in FIG. 27, except that wafer 29010 and cleaning device are set at angle β. Angle β is set from 0 degree to 90 degree.

Figure 30:
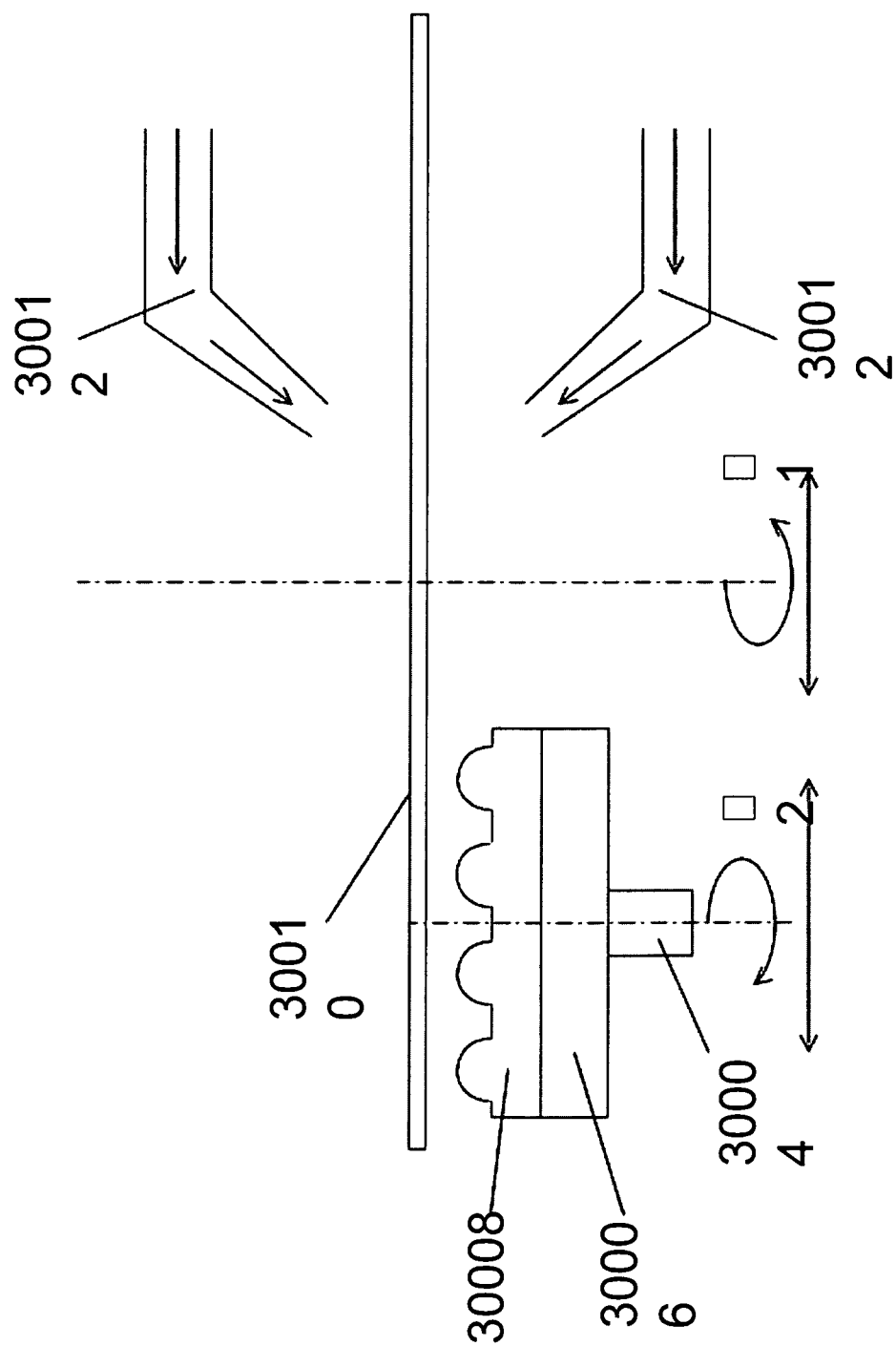
FIG. 30 depicts another exemplary wafer cleaning device.

FIG. 30 shows another embodiment of wafer cleaning device using a rotating plate according to the present invention. The embodiment is similar to those shown in FIG. 24, except that rotating plate 30008 and transducer 30006 are set at backside of wafer 30010.

Figure 31:
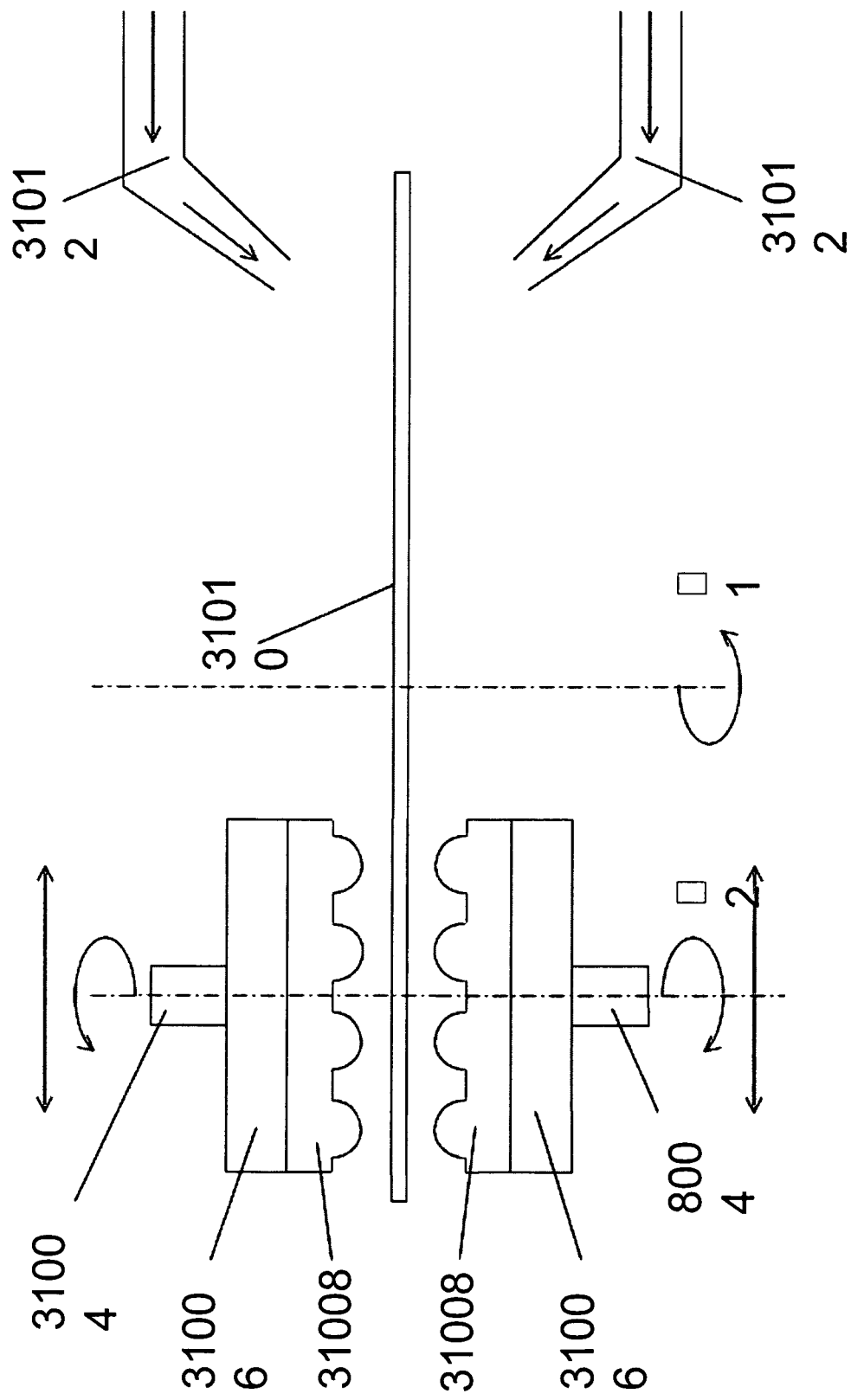
FIG. 31 depicts another exemplary wafer cleaning device.

FIG. 31 shows another embodiment of wafer cleaning device using a rotating plate according to the present invention. The embodiment is similar to those shown in FIG. 30, except that additional set of rotating plate 31008 and transducer 31006 are set at front side of wafer 31010.

Figure 32:
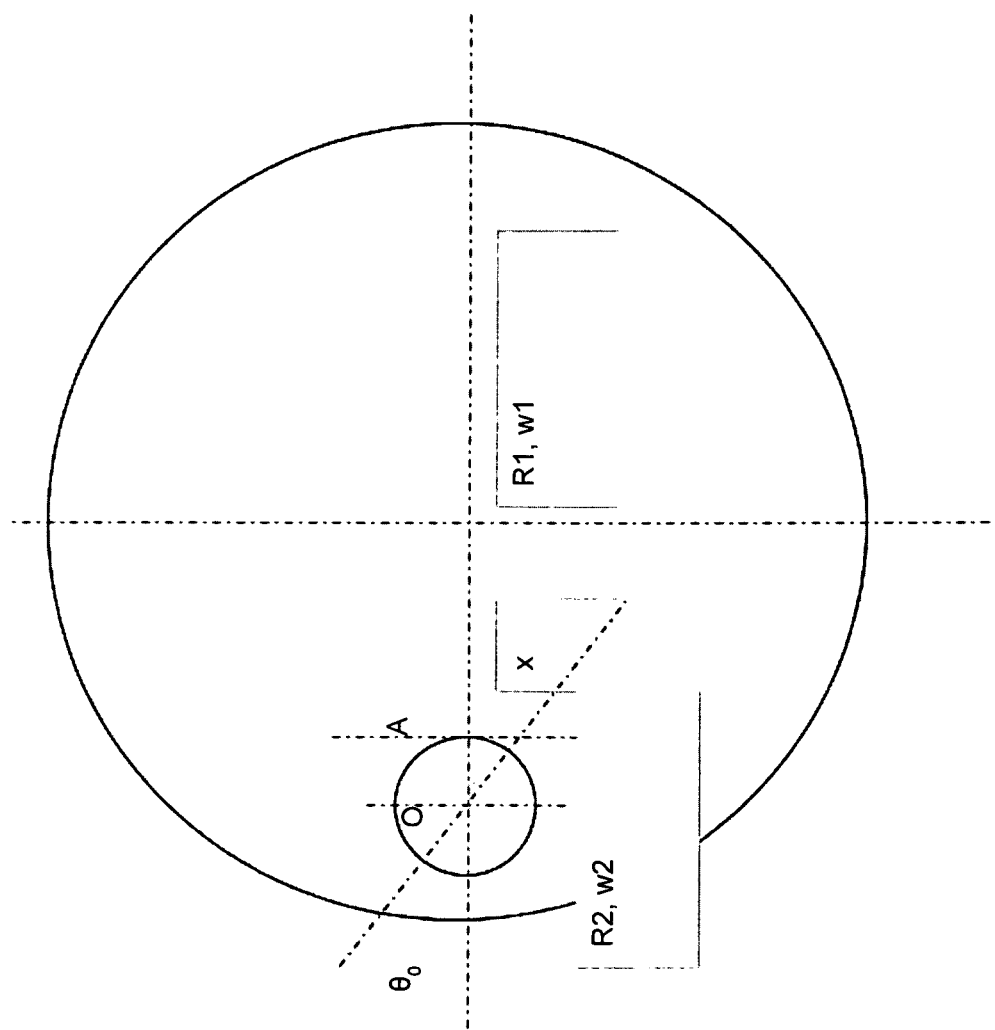
FIG. 32 depicts the circumstance where full and equal cleaning effects are to be derived in the present invention.

FIG. 32 shows the circumstance where full and equal cleaning effects are to be derived in the present invention. A is a point on wafer that overlays with the leading edge of the vibrating plate in the direction of plate movement at a particular time t, O is the center of the plate, x is the distance between point A and the center of the wafer or the article to be cleaned, θ is the angle between the grooves on the plate and the diameter of the wafer or the article.

To ensure that all the points on the wafer or article are cleaned by the plate, the distance that the plate moves along the diameter of the wafer or article while the wafer or article rotates a circle should be less than the diameter of the plate itself. Thus it can be derived that the maximum translational velocity (lateral speed) of the plate plate along the diameter of the wafer or article is:

$$v = \frac{2R_2\omega_1}{60}.$$

To ensure the full cleaning effect under the present invention, the vibrating plate in the present invention rotates at least π when a small area of interest on the wafer or article is in the range of the plate. In another word, the distance (d) between A and O in FIG. 32 must be smaller than the radius of the plate in the time that the plate rotates π.

Thus it is found that the condition $d^2=(x-v\Delta t-(x-R_2)\cos \omega_1\Delta t)^2+((x-R_2)\sin \omega_1\Delta t)^2 \le R_2^2$ must be satisfied.

Figure 33:
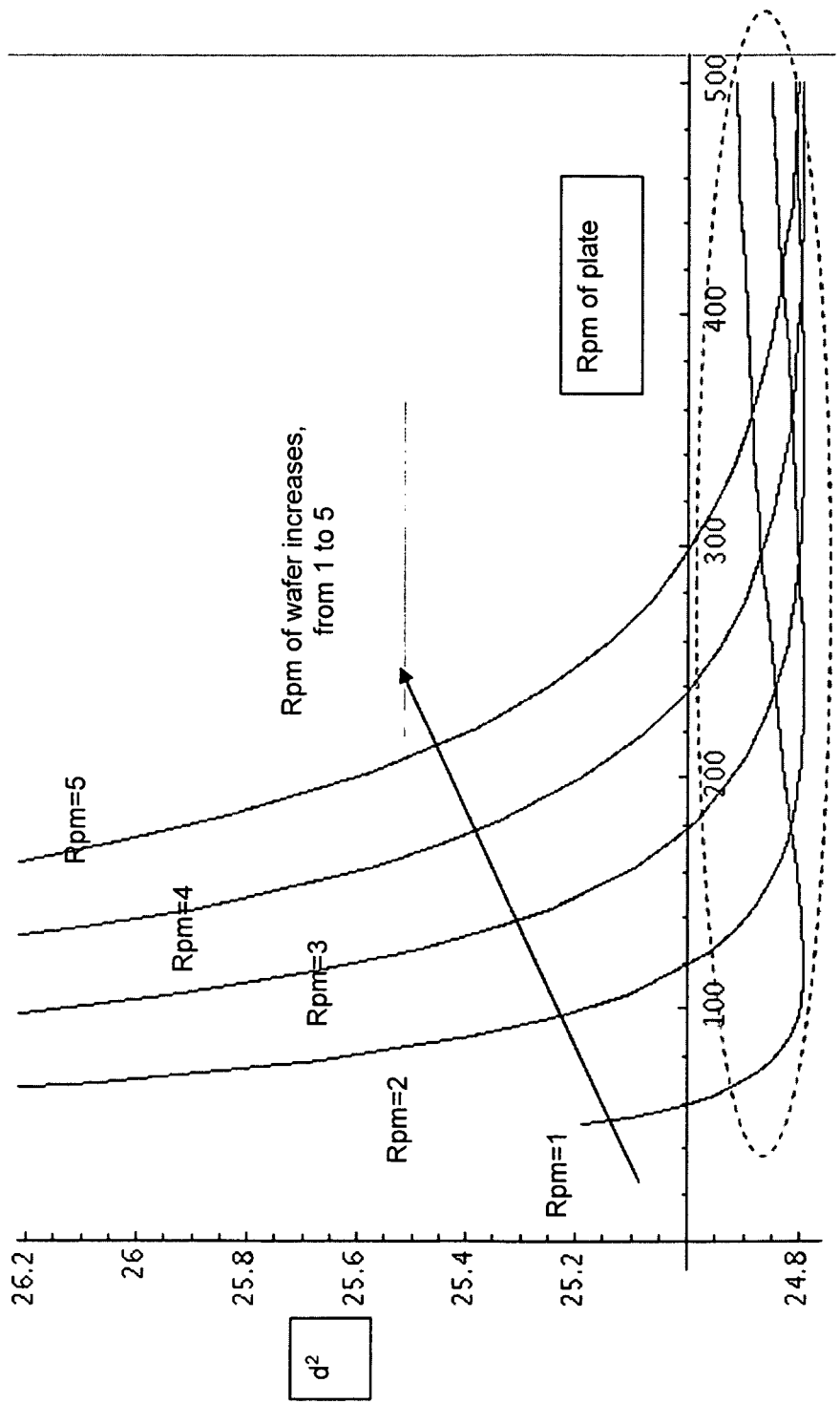
FIG. 33 depicts an example of a algorithm described in the present invention.

FIG. 33 shows an example of how the algorithm described above is applied with a set of inputs. The algorithm calculates for a space of operation between the x-axis and the part of the calculated curve below the x-axis where full cleaning effect is satisfied based on the input parameters, as highlighted by the dotted red circle.

Figure 34:
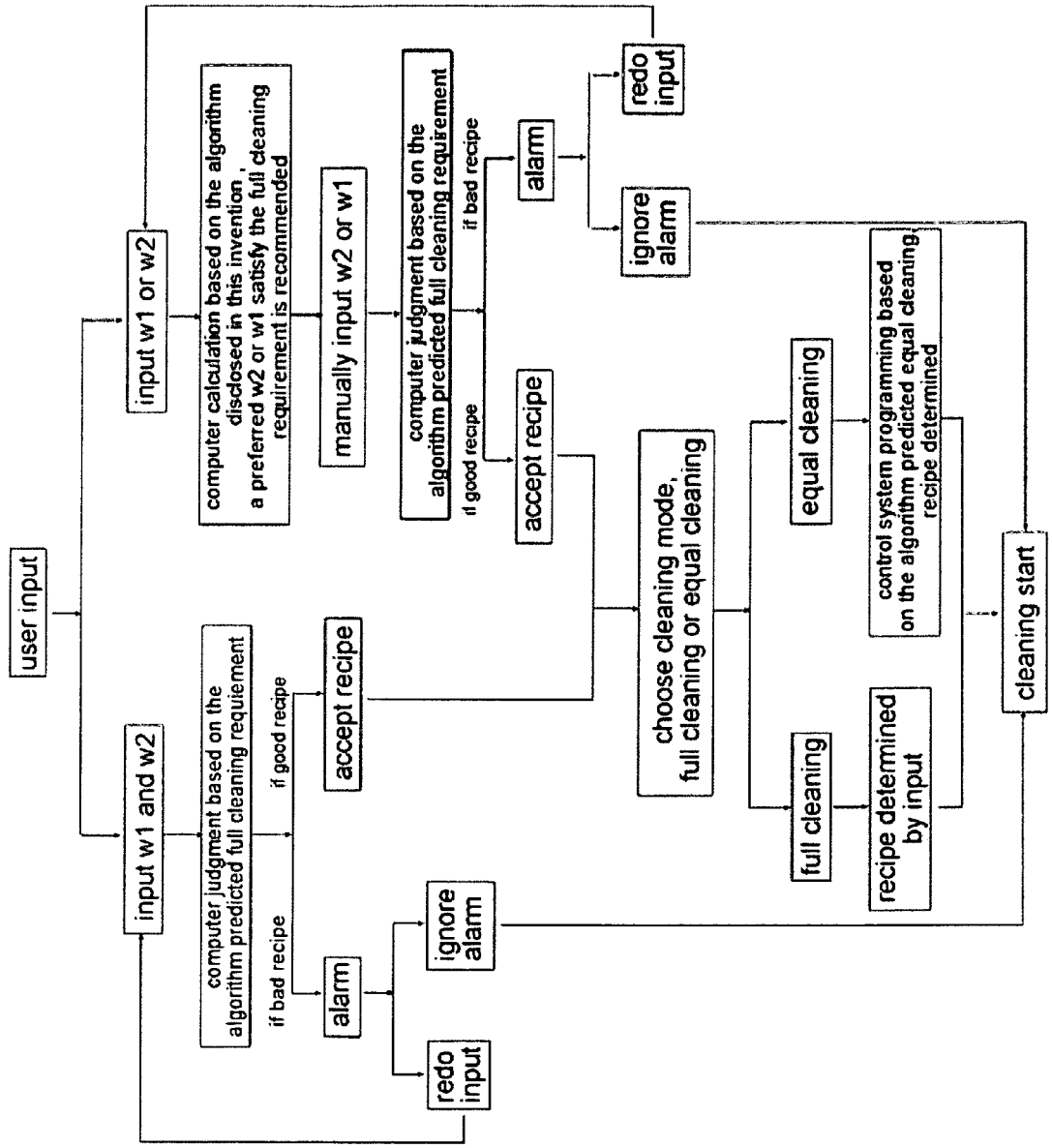
FIG. 34 depicts an architectural control system of the present invention.

FIG. 34 shows an architectural control system which is to be implemented in system software that allows the algorithm to check and recommend user input and provides feedback to users.

TABLE. 35 shows example results of wafer rotation speed calculated using the algorithm in present invention, as a function of plate center location relative to space, that satisfies the equal cleaning effect of the present invention under a circumstance where plate rotation speed is fixed and plate translational speed is varied.

TABLE. 36 shows example results of plate rotation speed calculated using the algorithm in present invention, as a function of plate center location relative to space, that satisfies the equal cleaning effect of the present invention under a circumstance where wafer rotation speed and plate translational speed are fixed.

TABLE. 37 shows example results plate rotation speed calculated using the algorithm in present invention, as a function of both wafer rotation speed and plate translational speed, that satisfies the full cleaning effect of the present invention.

Although the present invention has been described with respect to certain embodiments, examples, and applications, it will be apparent to those skilled in the art that various modifications and changes may be made without departing from the invention. For example, HF acid can be combined with other slat and acid to form electrolyte to reach the same purpose.

TABLE 35

| Rpm of plate is 90, fixed | | |
|---|---|---|
| Position along the radius of wafer, cm | Rpm of wafer | Radial velocity of plate, cm/s |
| 15 | 1.5 | 0.25 |
| 12 | 2.2 | 0.37 |
| 9 | 3.6 | 0.60 |
| 6 | 6.5 | 1.08 |
| 3 | 20.0 | 3.33 |

TABLE 36

| Rpm of wafer is 3 and radial velocity of plate is 0.5 cm/s, fixed | |
|---|---|
| Position along the radius of wafer, cm | Rpm of plate |
| 15 | 180 |
| 12 | 120 |
| 9 | 75 |
| 6 | 40 |
| 3 | 15 |

TABLE 37

| Rpm of wafer | Translational velocity of plate, cm/s | Rpm of plate |
|---|---|---|
| 1 | 0.17 | 60 |
| 2 | 0.33 | 120 |
| 3 | 0.50 | 180 |
| 4 | 0.67 | 240 |
| 5 | 0.83 | 300 |
| 6 | 1.00 | 360 |
| 7 | 1.17 | 420 |
| 8 | 1.33 | 480 |
| 9 | 1.50 | 540 |
| 10 | 1.67 | 600 |

The invention claimed is:

1. An apparatus for cleaning a wafer having at least one surface comprising:
   a chuck for holding the wafer, the chuck being rotated by a first driving mechanism;
   a plate positioned adjacent to the wafer defining a gap therebetween, wherein said plate has a surface and the apparatus is configured to translate the plate across the surface of the wafer in a direction parallel to the surface of the wafer;

a mechanical wave transducer attached to said plate causing said plate to vibrate, said mechanical wave transducer being a mega sonic transducer; and a second driving mechanism configured to rotate said plate and said transducer attached to said plate while maintaining the gap between the plate and the wafer, wherein the second driving mechanism is configured to rotate the plate and the transducer around an axis vertical to said plate such that the following condition is satisfied: a distance d between point A and point O must be smaller than the radius of said plate in the time that the plate rotates π radian, wherein point A is a point on the wafer that overlays with the leading edge of said plate in the direction of plate movement and point O is the center of said plate.

2. The apparatus of claim 1, wherein said plate is positioned parallel to the surface of the wafer.

3. The apparatus of claim 1, wherein said plate moves in a straight line.

4. The apparatus of claim 1, wherein said plate moves in a curved line.

5. The apparatus of claim 1, wherein the wafer moves in a direction parallel to the surface of said plate.

6. The apparatus of claim 5, wherein the wafer moves in a straight line.

7. The apparatus of claim 1, wherein the wafer moves in a curved line.

8. The apparatus of claim 1, wherein the wafer is rotated around the center of the wafer.

9. The apparatus of claim 1, wherein said gap between said plate and the wafer is in the range of 0.1 mm to 10 mm.

10. The apparatus of claim 1, wherein the apparatus further comprising a nozzle to deliver chemical fluid onto the surface of the wafer.

11. The apparatus of claim 10, wherein said nozzle is attached together with said plate.

12. The apparatus of claim 1, wherein the surface of said plate is a plane.

13. The apparatus of claim 1, wherein the surface of said plate is formed by multiple half cycle columns.

14. The apparatus of claim 1, wherein the surface of said plate is formed by multiple triangular columns.

15. The apparatus of claim 1, wherein the surface of said plate is formed by multiple rectangular columns.

16. The apparatus of claim 1, wherein the surface of said plate is formed by multiple elliptical columns.

17. The apparatus of claim 1, wherein the surface of said plate is formed by single concave column.

18. The apparatus of claim 1, wherein the surface of said plate is formed by single convex column.

19. The apparatus of claim 1, wherein the surface of said plate is formed by one convex column and one concave column.

20. The apparatus of claim 1, wherein the surface of said plate is formed by multiple half spheres.

21. The apparatus of claim 1, wherein the surface of said plate is formed by multiple pyramids.

22. The apparatus of claim 1, wherein the surface of said plate is formed by multiple half octagon columns.

23. The apparatus of claim 1, wherein said mega sonic transducer has a frequency range of 200 kHz to 2 MHz.

24. The apparatus of claim 1, wherein said plate has a plurality of holes to introduce chemical fluid.

25. The apparatus of claim 1, wherein said plate has a cycle contour.

26. The apparatus of claim 1, wherein said plate has a triangular contour.

27. The apparatus of claim 1, wherein said plate has a rectangular contour.

28. The apparatus of claim 1, wherein said plate has an octagon contour.

29. The apparatus of claim 1, wherein said plate has an elliptical contour.

30. The apparatus of claim 1, wherein the wafer is set in a horizontal direction.

31. The apparatus of claim 1, wherein the wafer is set in a vertical direction.

32. The apparatus of claim 1, wherein the wafer is set at an angle relative to a horizontal direction, and said angle is in the range of 0 to 90 degree.

33. The apparatus of claim 1, wherein said plate is set above the surface of the wafer.

34. The apparatus of claim 1, wherein said plate is set underneath the surface of the wafer.

35. The apparatus of claim 1 wherein the surface of the wafer is a first surface of the wafer, wherein the wafer comprises a second surface that is opposite to the first surface, wherein the plate is set above the first surface of the wafer, and wherein the apparatus comprises another plate that is set underneath the second surface of the wafer.

36. The apparatus of claim 35, wherein the apparatus further comprising two nozzles to deliver chemical fluids, one set above the first surface of the wafer, and another one nozzle set underneath second surface of the wafer.

* * * * *